US012466178B2

(12) United States Patent
Mattero et al.

(10) Patent No.: US 12,466,178 B2
(45) Date of Patent: Nov. 11, 2025

(54) STENCIL PRINTER COVER HAVING MOVABLE DOOR WITH CLOSING FEATURE

(71) Applicant: Illinois Tool Works Inc., Glenview, IL (US)

(72) Inventors: Patsy A. Mattero, Smithfield, RI (US); Kenneth J. King, East Freetown, MA (US)

(73) Assignee: Illinois Tool Works Inc., Glenview, IL (US)

( * ) Notice: Subject to any disclaimer, the term of this patent is extended or adjusted under 35 U.S.C. 154(b) by 31 days.

(21) Appl. No.: 18/594,357

(22) Filed: Mar. 4, 2024

(65) Prior Publication Data

US 2025/0276512 A1    Sep. 4, 2025

(51) Int. Cl.
| | | |
|---|---|---|
| B41F 15/36 | (2006.01) | |
| B41F 15/08 | (2006.01) | |
| B41F 15/26 | (2006.01) | |
| B41F 15/42 | (2006.01) | |
| B41F 15/44 | (2006.01) | |
| B41L 13/02 | (2006.01) | |
| B41L 13/18 | (2006.01) | |
| H05K 3/12 | (2006.01) | |

(52) U.S. Cl.
CPC ......... *B41F 15/0881* (2013.01); *B41F 15/26* (2013.01); *B41F 15/36* (2013.01); *B41F 15/423* (2013.01); *B41F 15/44* (2013.01); *B41L 13/02* (2013.01); *B41L 13/18* (2013.01); *H05K 3/1225* (2013.01); *B41P 2215/10* (2013.01)

(58) Field of Classification Search
CPC .......... B41F 15/26; B41F 15/36; B41F 15/44; B41F 15/423; B41F 15/0881; B41L 13/02; B41L 13/18; H05K 3/125; B41P 2215/10
See application file for complete search history.

(56) References Cited

U.S. PATENT DOCUMENTS

2018/0229495 A1* 8/2018 Yamamoto .............. B41F 33/00
2024/0034049 A1    2/2024 King et al.

FOREIGN PATENT DOCUMENTS

| JP | 4893727 B2 * | 3/2012 |
| WO | 2020/217468 A1 | 10/2020 |
| WO | 2023/239535 A1 | 12/2023 |

* cited by examiner

*Primary Examiner* — Christopher E Mahoney
*Assistant Examiner* — Marissa Ferguson-Samreth
(74) *Attorney, Agent, or Firm* — Lando & Anastasi, LLP

(57) ABSTRACT

A cover of a stencil printer is hingedly mounted to a frame, and movable between a closed and open positions. The cover includes an elongate opening formed therein and a movable door configured to selectively close the elongate opening. The elongate opening is sized to enable the stencil and/or a tooling tray to pass through. A controller is configured to control movement of the movable door between a closed position and an open position. A sensor assembly is proximate the elongate opening. The sensor assembly is coupled to the controller and configured to detect an object within the elongate opening when moving the movable door to the closed position. The sensor is configured to generate a signal to the controller when detecting an object within the elongate opening. The controller, upon receiving the signal from the sensor, is configured to move the movable door to the open position.

22 Claims, 17 Drawing Sheets

STENCIL PRINTER COVER HAVING MOVABLE DOOR WITH CLOSING FEATURE

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for replacing items in a stencil printer.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the vision inspection system is further employed to provide a two-dimensional or a three-dimensional inspection of the solder paste on the circuit board.

Present day stencil printers require manual intervention to perform routine operations. For example, during a changeover, an operator must perform many manual tasks, such as changing a stencil, replacing a solder paste cartridge, replacing squeegee blades, and replacing support tooling. Each of these tasks require the operator to manually perform the task. For example, with most stencil printers, the operator must open the stencil printer cover, unlock the stencil, remove the stencil, properly insert a replacement stencil, and lock the replacement stencil in place. Other items are subject to replacement as well, such a squeegee blades, support tooling and solder paste cartridges. A changeover operation can take as long as 30 minutes, during which the stencil printer is not operating, which may result in the PCB fabrication line not operating.

SUMMARY OF THE DISCLOSURE

One aspect of the present disclosure is directed to a stencil printer for printing an assembly material on an electronic substrate. In one embodiment, the stencil printer comprises a frame, a stencil coupled to the frame, the stencil having apertures formed therein, a support assembly coupled to the frame, the support assembly being configured to support the electronic substrate in a print position beneath the stencil, a print head gantry coupled to the frame, and a print head assembly supported by the print head gantry in such a manner that the print head assembly is configured to traverse the stencil during print strokes. The print head assembly includes a print head having a squeegee blade assembly configured to roll solder paste along the stencil. The stencil printer further comprises a cover coupled to the frame to enclose operating components of the stencil printer, including the stencil, the support assembly, the print head gantry and the print head assembly. The cover is hingedly mounted to the frame of the stencil printer and movable between a closed position and an open position. The cover includes an elongate opening formed therein and a movable door configured to selectively close the elongate opening. The elongate opening is sized to enable the stencil and/or a tooling tray to pass through. The stencil printer further comprises a controller coupled to the movable door, the controller being configured to control movement of the movable door between a closed position and an open position, and a sensor assembly proximate the elongate opening. The sensor assembly is coupled to the controller and configured to detect an object within the elongate opening when moving the movable door to the closed position. The sensor is configured to generate a signal to the controller when detecting an object within the elongate opening. The controller, upon receiving the signal from the sensor, is configured to move the movable door to the open position.

Embodiments of the stencil printer further may include slidably coupling the movable door to the cover frame to enable movement of the movable door with respect to the cover between the closed position and the open position. The sensor assembly may include a linear resistive pressure sensor configured to detect a force created by the object when engaging the linear resistive pressure sensor. The sensor assembly further may include a foam or soft laminate disposed on the linear resistive pressure sensor. The linear resistive pressure sensor may be coupled to a conversion PCB and configured to generate a pressure sensor feedback interrupt signal when detecting the force created by the object. The conversion PCB may be coupled to an automated machine personal computer PC, pneumatic controls, and a servo/stepper motor controller associated with the movable door. The conversion PCB may be configured to generate a signal to the automated machine PC and a signal to the servo/stepper motor controller. A CAN BUS may be provided to enable bi-directional communication between the automated machine PC and the servo/stepper motor controller. The movable door may include a movable door frame and at least one panel secured to the movable door frame. The cover further may include two linear slides mounted on the cover frame of the cover. The movable door further may include a mounting bracket secured to the movable door frame of the movable door. The cover further may include a first linear slide secured to the cover frame of the cover on one side of the movable door and a second linear slide secured to the cover frame of the cover on the other side of the movable door. The movable door further may include at least one first mounting bracket secured to the movable door frame of the movable door on one side of the movable door and at least one second mounting bracket secured to the movable door frame of the movable door on the other side of the movable door. The cover further may include a pneumatic interlock assembly to secure the position of the movable door in the closed position. The pneumatic interlock assembly may include a switch to ensure that the movable door is in a closed position prior to operating the stencil printer. The movable door may be configured to be moved by at least one lift bracket associated with a movable cart. The movable door may include an access panel hingedly mounted to a frame of the movable door. The access panel may be configured to be manipulated manually between open and closed positions. The movable door may include an assembly configured to provide a resistance to a downward movement of the movable door.

Another aspect of the present disclosure is directed to a method of presenting a stencil or items within a stencil printer. In one embodiment, the method comprises: inserting the stencil into and/or removing a tooling tray from an elongate opening provided in a cover of the stencil printer; closing a movable door configured to close the elongate opening; detecting an object within the elongate opening when moving the movable door to the closed position; and opening the movable door upon detecting the object.

Embodiments of the method further may include detecting the object within the elongate opening by generating a signal to a controller of the stencil printer, with the controller being configured to move the movable door to the open position. Detecting the object within the elongate opening may be performed by a sensor assembly coupled to the controller. The sensor assembly may include a linear resistive pressure sensor configured to detect a force created by the object when engaging the linear resistive pressure sensor. The method further may include cushioning the object. The object may be cushioned by a foam laminate disposed on the linear resistive pressure sensor. The linear resistive pressure sensor may be coupled to a conversion PCB and may be configured to generate a pressure sensor feedback interrupt signal when detecting the force created by the object. The conversion PCB may be coupled to an automated machine personal computer PC pneumatic controls associated with the movable door, and a servo/stepper motor controller associated with the movable door. The conversion PCB may be configured to generate a signal to the automated machine PC and a signal to the servo/stepper motor controller. A CAN BUS may be provided to enable bi-directional communication between the automated machine PC and the servo/stepper motor controller.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
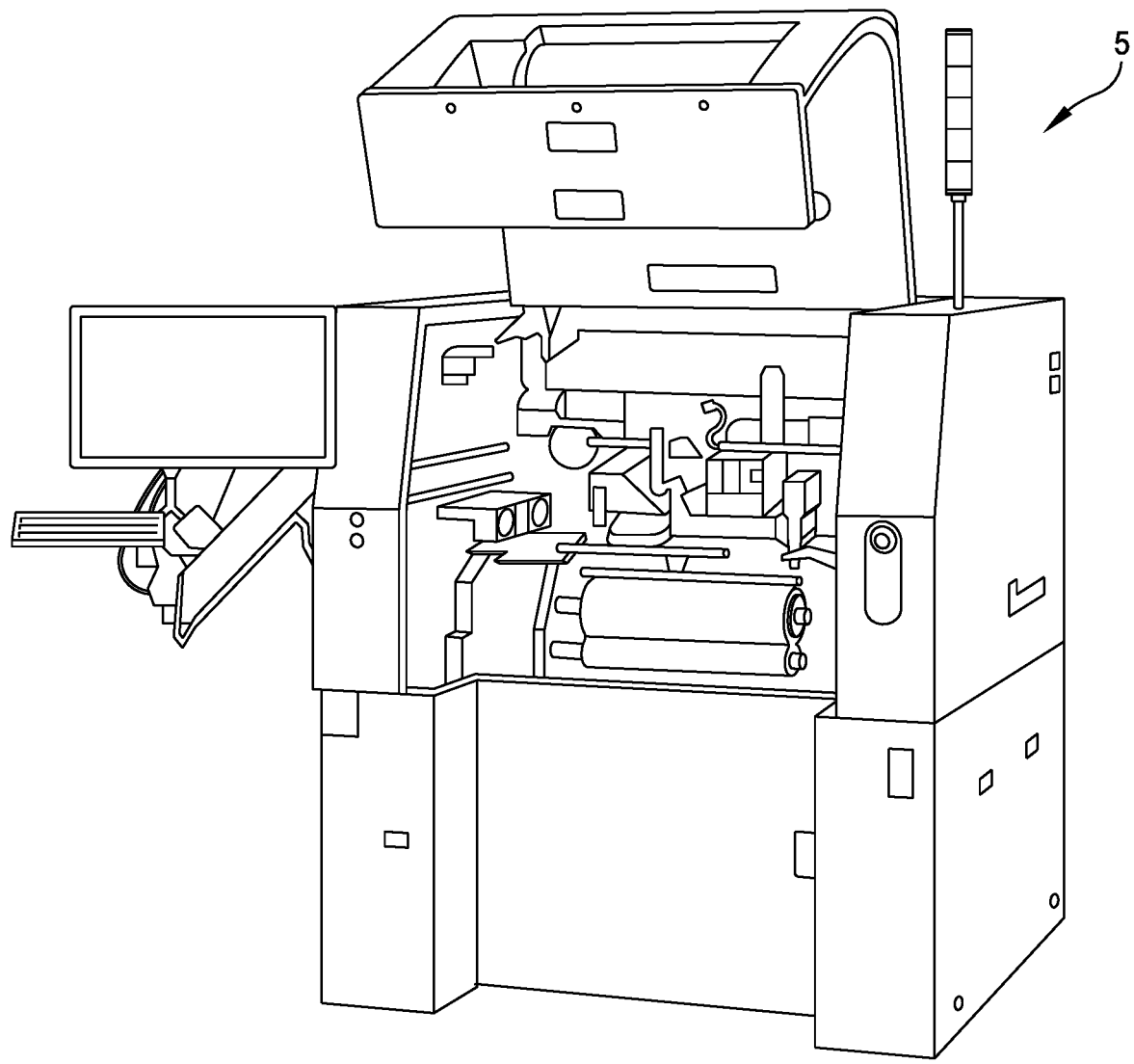
FIG. 1 is a front view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

For purposes of illustration, embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulents. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is a Momentum® series stencil printer platform offered by ITW Electronic Assembly Equipment of Hopkinton, Massachusetts.

Figure 2:
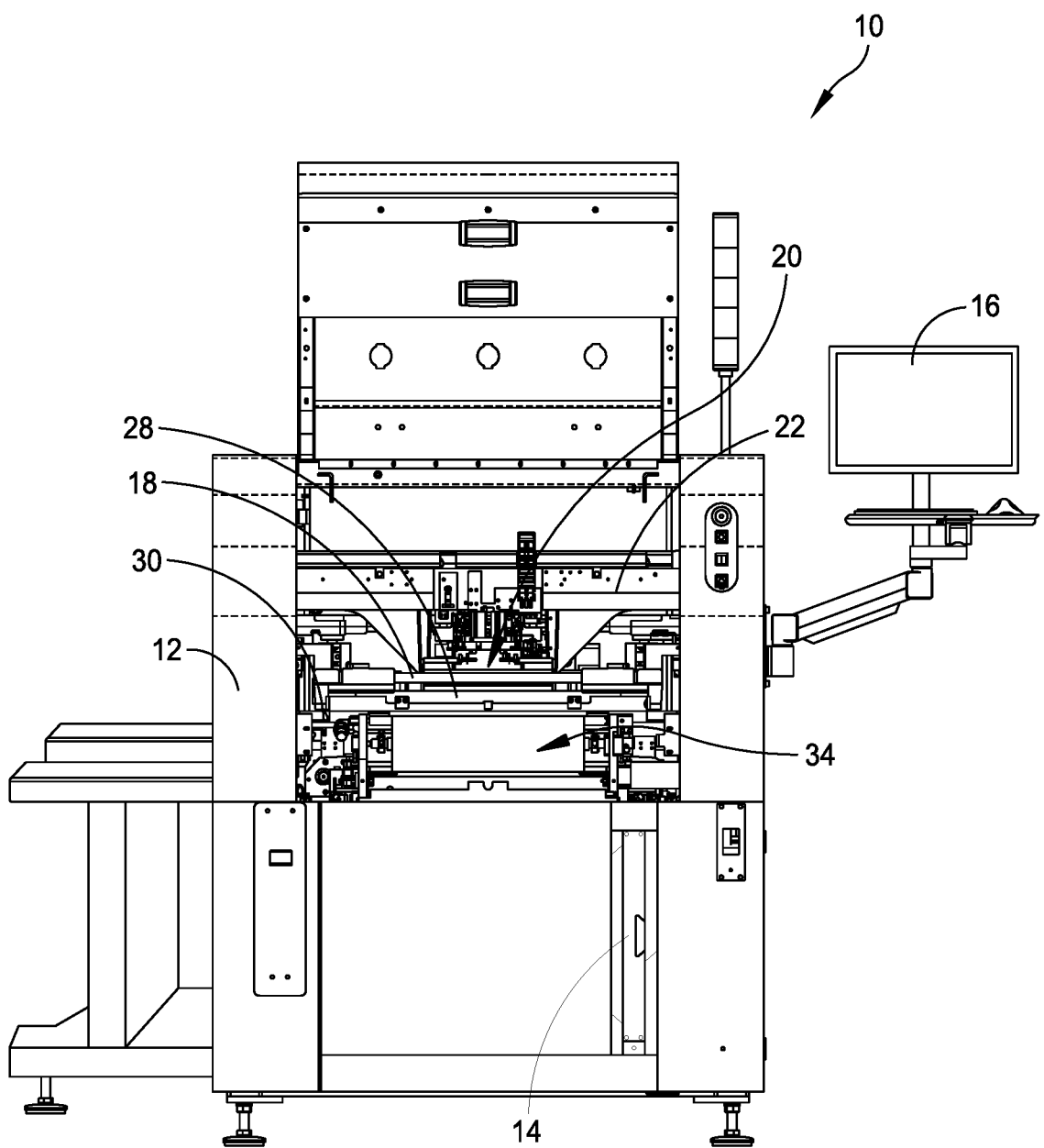
FIG. 2 is a front perspective view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
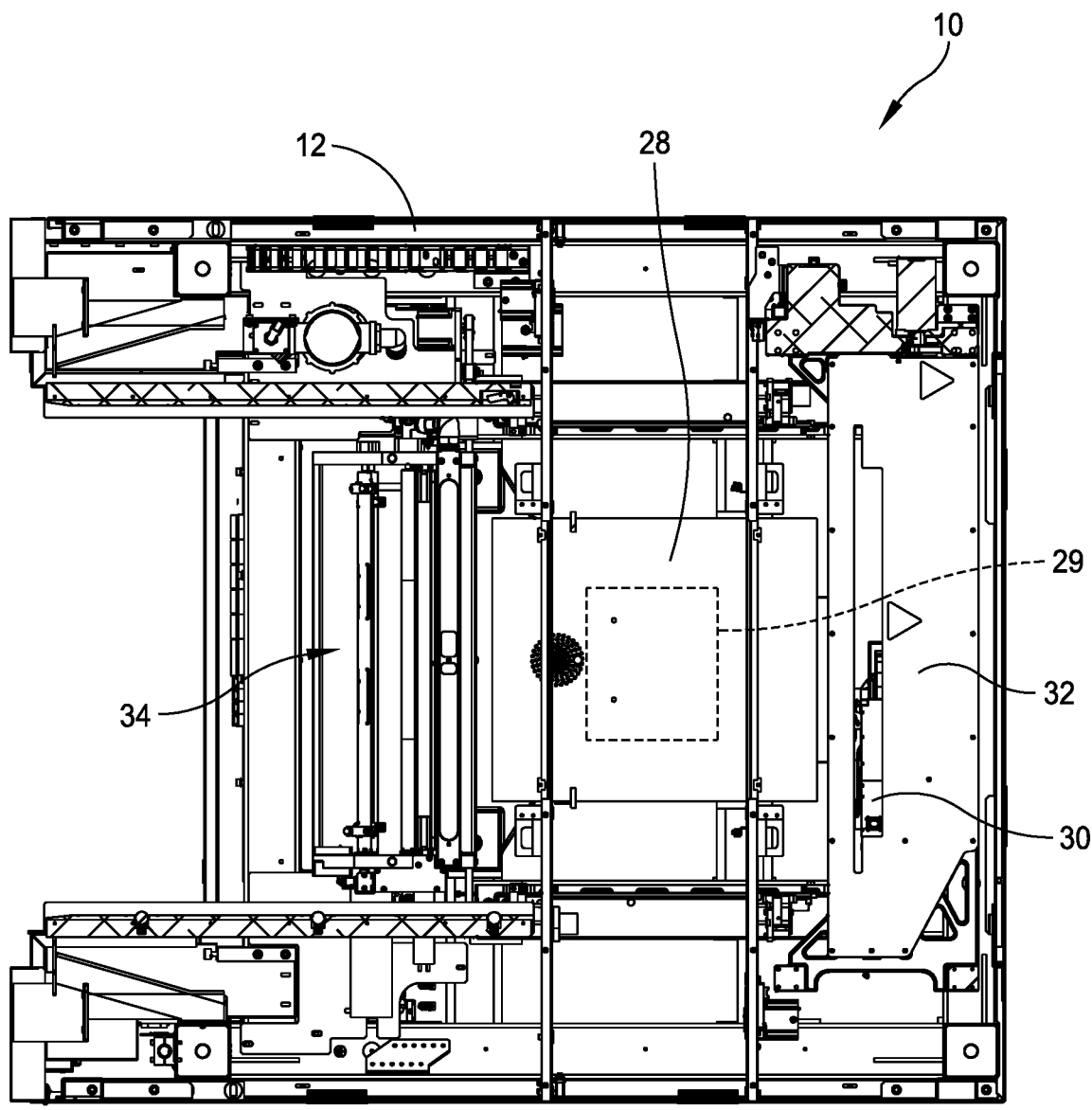
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, that provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

As mentioned above, stencil printers require manual intervention to perform replacement of certain parts and/or replenishment operations. For example, a typical stencil requires replacement after a certain period of time, e.g., four hours. Also, stencils need replacement for separate production runs. In addition, solder paste cartridges, which supply temperature-controlled solder paste to the stencil printer, require replacement over time, e.g., within four hours or less. A separate production run may require a different solder paste material. Another item requiring periodic replacement is squeegee blades, which are subject to wearing during use. And finally, tooling used to support a substrate in a print position is subject to replacement when changing from one production product to another.

In one embodiment, a method of replacing a stencil and/or items placed on tooling trays may include, when a request for a new stencil and/or item on a tooling tray is made, either for a new production run or because of wear on an existing stencil, a clean stencil and/or item is provided on a movable cart. At the production line, the "dirty" or used stencil and/or item is removed from the stencil printer and the "clean" or new stencil and/or item is inserted into the stencil printer from the movable cart and secured for use. The dirty stencil and/or item may then be transported to a cleaning station where the stencil and/or item is cleaned and ready for reuse. Once cleaned, the stencil and/or item may be transported back to the stencil printer or a stockroom, where the stencil and/or item can be reused during the same or different production run.

Embodiments of the present disclosure are directed to a delivery system that is configured to automate a changeover process for a stencil printer and to implement one or more of the methods described herein. In one embodiment, the delivery system includes a movable cart that is configured to engage a stencil printer to supply and receive replacement and replenishment parts and materials to the stencil printer. For example, the stencil printer may include a docking station that is configured to receive the movable cart. The docking station may include an interface that enables the movable cart to communicate with the stencil printer. A single movable cart may be configured to include changeover stencils and/or replacement stencils. During a changeover, for example, the stencil printer must be reconfigured to produce different items. Thus, a new stencil may be employed within the stencil printer to produce a different product.

The changeover process described herein can be achieved by a single movable cart that is configured to replace and/or replenish each item. In other embodiments, more than one movable cart can be provided. For example, for stencil changeover, the movable cart is configured to support a predetermined number of stencils. The movable cart and/or the stencil printer can be configured to identify the stencils, store the stencils, transport the stencils to and from the stencil printer, inspect the stencils, and interface with the stencil printer. The movable cart also may be configured to remove used parts, such as stencils, from the stencil printer.

Embodiments of the present disclosure are further directed to a delivery system that is configured to automate a replenishment process for a stencil printer. In one embodiment, the delivery system includes a movable cart that is configured to engage a stencil printer to supply and receive replacement and replenishment parts and materials to the stencil printer. For example, the stencil printer may include a docking station that is configured to receive the movable cart. The docking station may include an interface that enables the movable cart to communicate with the stencil printer. A single movable cart may be configured to include changeover stencils and replacement stencils.

Figure 4:
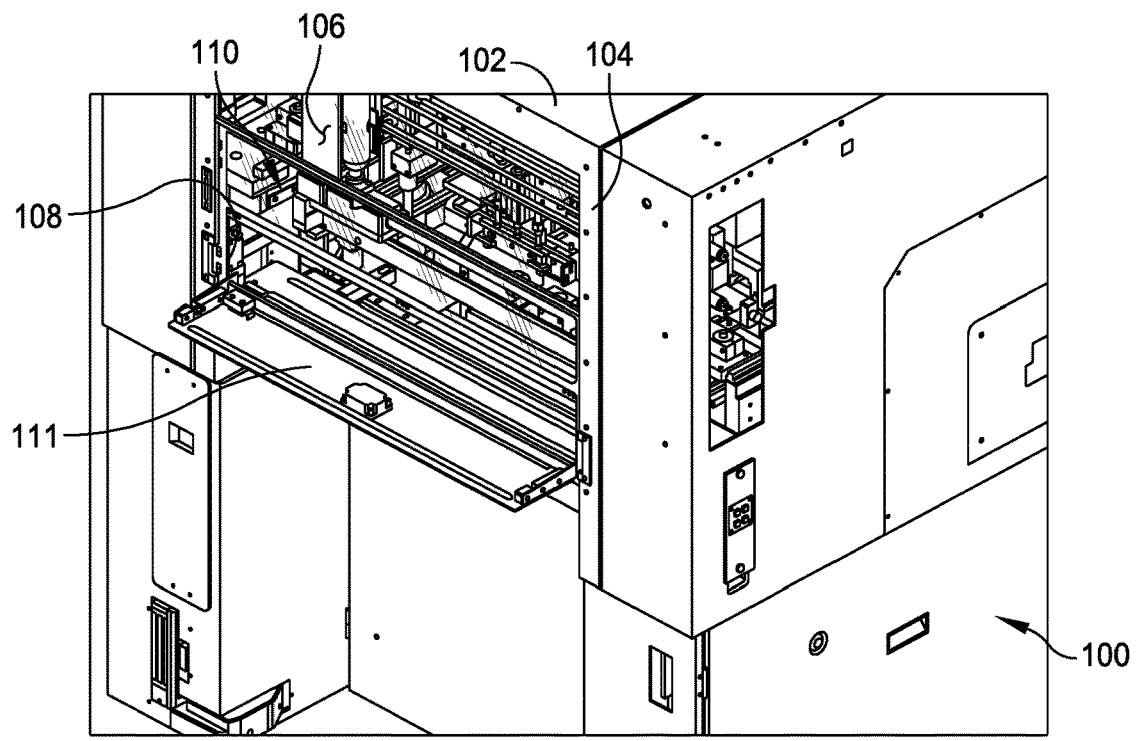
FIG. 4 is a perspective view of a portion of a cover of a stencil printer of an embodiment of the present disclosure, the cover having a movable door configured to enclose a slot, the movable door being shown in an open position.

Referring to FIG. 4, a stencil printer, generally indicated at 100, unless described differently, is substantially identical to stencil printer 10 described above. The stencil printer 100 includes a cover generally indicated at 102 that is hingedly secured to the frame of the stencil printer to move from an open position in which the interior of the stencil printer is accessible to a shown closed position in which the operating components of the stencil printer described above are enclosed. In a certain embodiment, the cover 102 of the stencil printer 100 is fabricated from a metallic frame 104 having panels embodying a see-through material, e.g., plexiglass, each indicated at 106, to enable an operator to view the working components of the stencil printer 100 during operation.

As shown, the cover 102 includes an elongate slot 108, which enables stencils and items positioned in tooling trays to be inserted and removed from the stencil printer 100. The cover 102 further includes a movable door, generally indicated at 110, that is slidably mounted along opposite edges of the elongate slot 108 and sized to enclose the elongate slot when in a closed position. The movable door 110 is configured to move up-and-down with respect to the cover. In one embodiment, the movable door 110 includes an access panel 111, hingedly attached to the frame 104 of the cover enable an operator to manually insert and retrieve items from the stencil printer 100 through the elongate slot 108.

Figure 5:
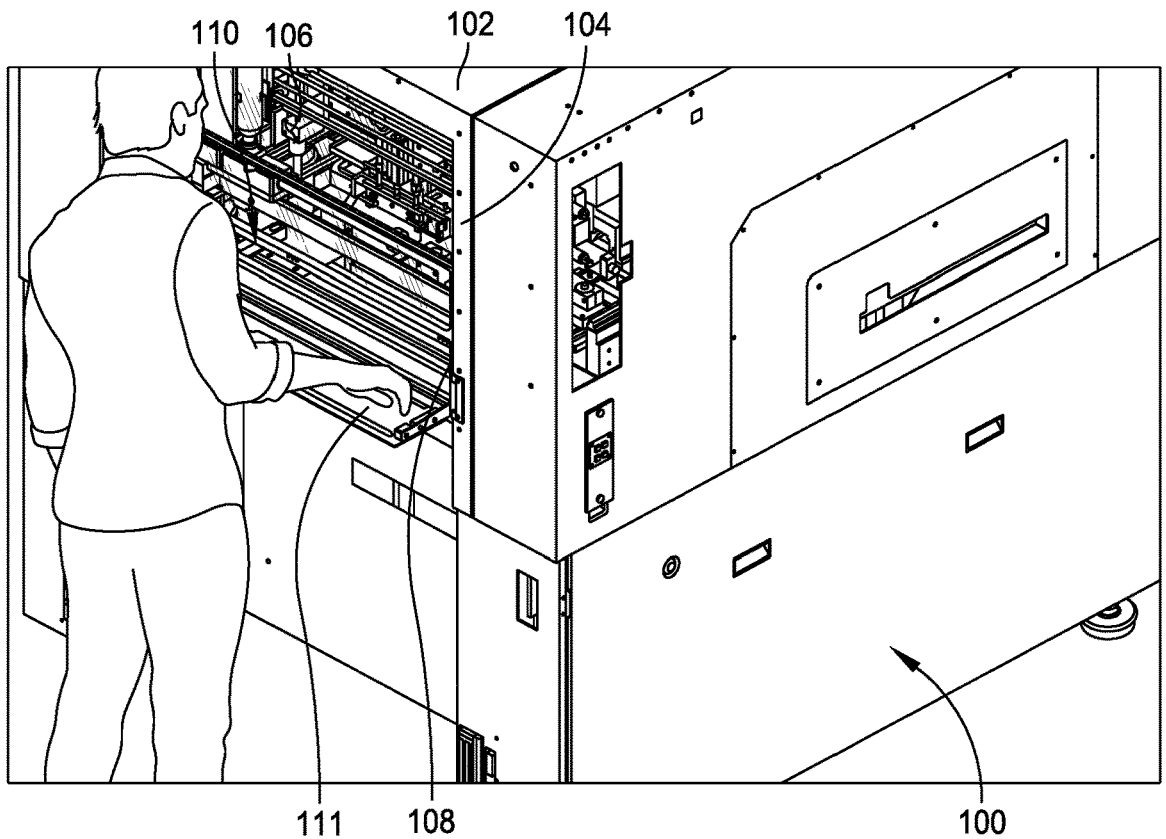
FIG. 5 is a perspective view of the portion of the cover of the stencil printer shown in FIG. 4, with an operator presenting an item to the stencil printer.

FIG. 4 illustrates the access panel 111 of the movable door 110 shown in an open position to enable a stencil or items on a tooling tray, such as squeegee blades and tooling, to be inserted into and retrieved from the stencil printer. Specifically, when the access panel 111 of the movable door 110 is in the open position, the elongate slot 108 functions as a mail slot to enable a partially automated replacement of items, including the stencil, squeegee blades and tooling. An operator can present the stencil and/or tooling tray to the elongate slot, and an end effector or tooling load/unload mechanism associated with the print head of the stencil printer 100 retrieves and returns the stencil and/or tooling tray back to the operator. FIG. 5 illustrates an operator presenting an item to the stencil printer 100 through the elongate slot 108, with the access panel 111 being shown in the open position.

During a product changeover, the software associated with the controller of the stencil printer 100 prompts the operator to load or replace the required item(s), walking the operator through the process step-by-step. Once loaded and production is ready to resume the stencil printer 100 scans each new item added to verify that the correct items for the print job have been loaded prior to continuing.

Figure 6:
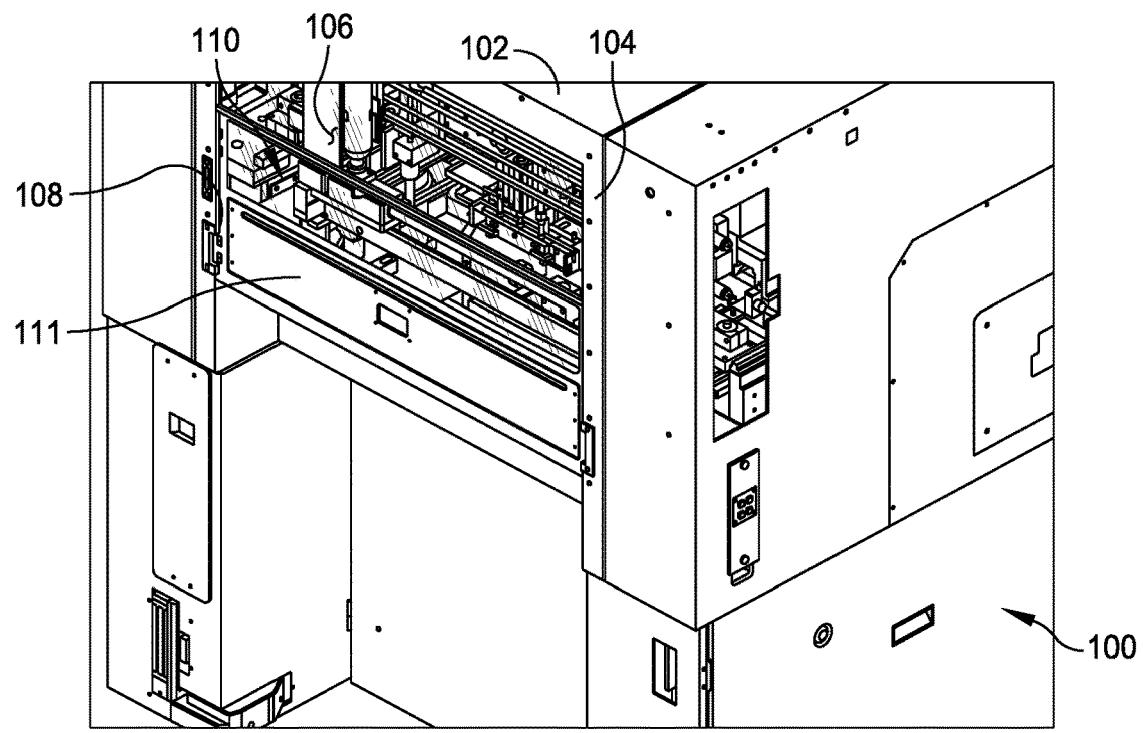
FIG. 6 is a perspective view of the portion of the cover of the stencil printer with the movable door being shown in a closed position.
Figure 7:
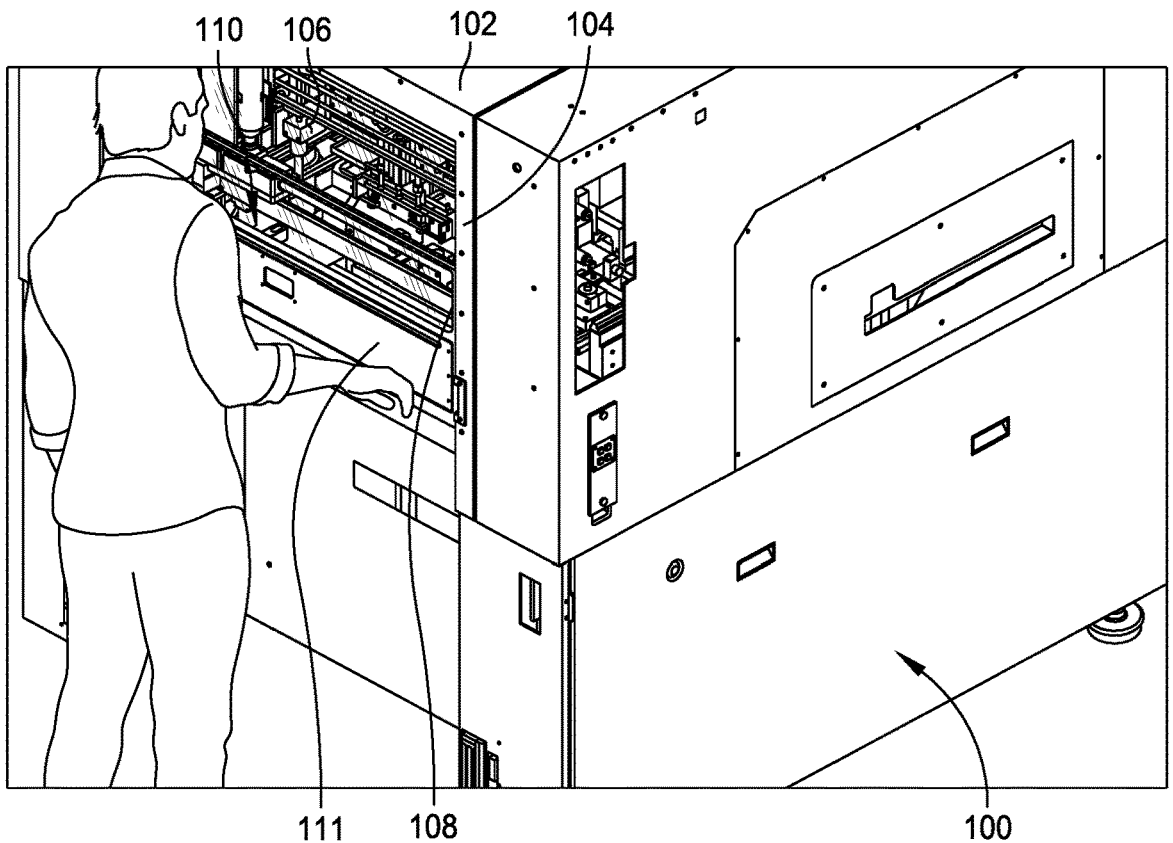
FIG. 7 is a perspective view of the portion of the cover of the stencil printer shown in FIG. 6, with an operator standing in front of the movable door.

FIG. 6 illustrates the access panel 111 of the movable door 110 shown in a closed position to enclose the working components of the stencil printer. As will be described in greater detail below, the movable door 110 of the cover 102 can be configured to be lifted by a movable cart (described below) to enable the movable cart to interface with the stencil printer 100 in such a way that the stencil printer is able to place or remove printed circuit board (PCB) support tooling, squeegee blades, and/or stencils while keeping the stencil printer inaccessible from any operator interface to the inside of the stencil printer. FIG. 7 illustrates an operator standing in front of the movable door 110, with the access panel 111 and the movable door being shown in closed positions.

Figure 8:
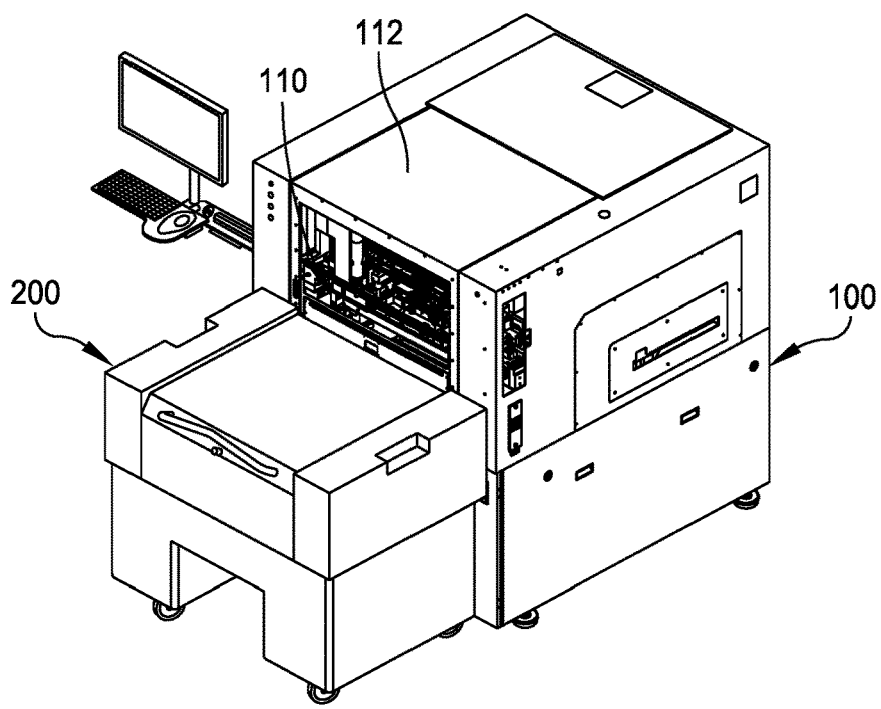
FIG. 8 is a perspective view of a stencil printer and a movable cart.
Figure 9:
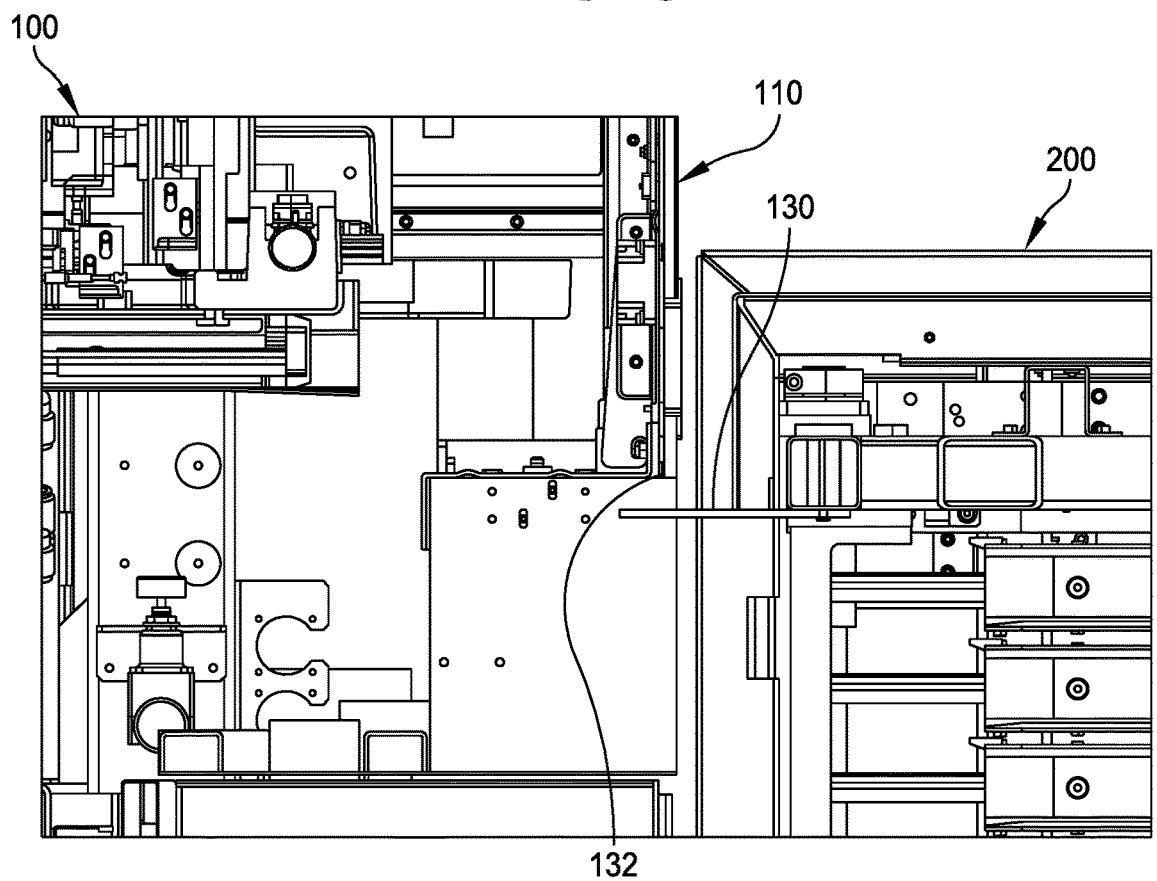
FIG. 9 is a cross sectional view of the stencil printer and the movable cart shown in FIG. 8.

Referring to FIGS. 8 and 9, a movable cart, generally indicated at 200, is shown in a docking position with respect to the stencil printer 100. As will be described in greater detail below, the movable cart 200 includes lift brackets at a front of the movable cart to lift the movable door 110 of the cover 102 of the stencil printer 100 to open the movable door. The movable cart 200 is docked to the stencil printer 100 and the lift brackets on the front of the movable cart are provided to engage an underside of the movable door 110 of the cover 102. The movable cart 200 is powered on at this point and a door interlock assembly associated with the movable door 110 is disabled. Based on the items being added or removed from the stencil printer 100, the controller of the stencil printer determines which shelf in the movable cart 200 will align with the stencil shelf in the stencil printer, for example. The movable cart 200 passively lifts the movable door 110 in the z-axis direction to a required height and once in position, the movable cart is prompted to either prepare to accept the item or items being loaded or unloaded in or out of the stencil printer 100. If prompted to unload, for example a stencil, the stencil is unloaded from the stencil printer 100 to the movable cart 200 in the y-axis directly and the movable cart stores the stencil and then indexes in the z-axis directly to load or unload the next item(s). The next item can be another stencil, and/or an item, such as tooling and/or squeegee blades on a tooling tray, or an empty tooling tray.

Figure 10:
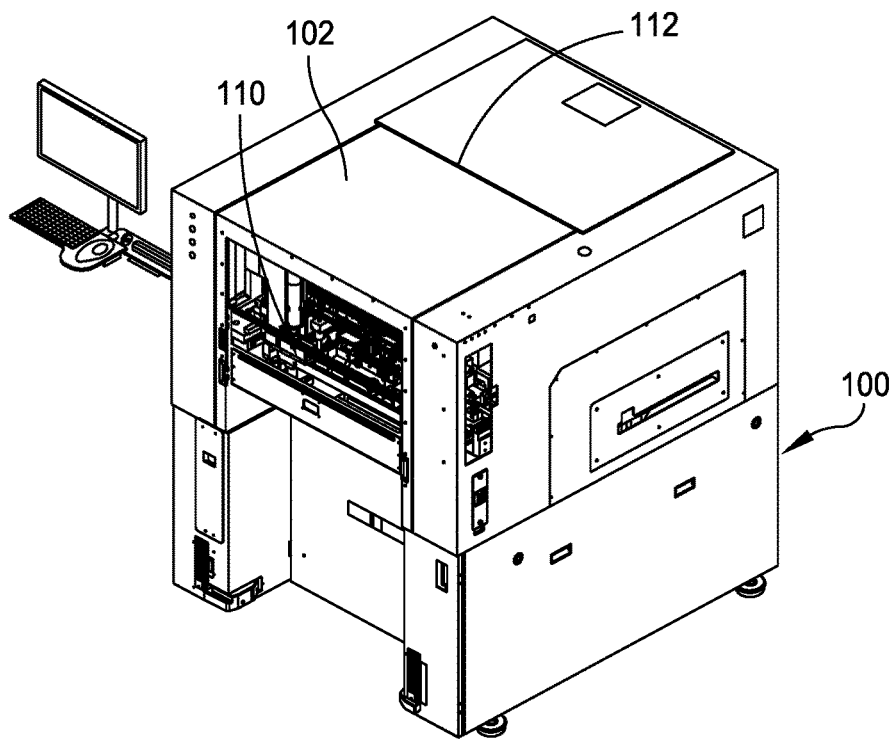
FIG. 10 is a perspective view of the stencil printer.

FIG. 10 illustrates the movable door 110 of the cover 102 of the stencil printer 100 in a maximum or fully opened position. In this position, the elongate slot 108 can accommodate up to four shelves of the movable cart 200. Depending on stencil printer requirements, the stencils and/or tooling trays may be loaded or unloaded from the stencil printer 100 to the movable cart 200 or the movable cart to the stencil printer in the y-axis direction. The movable cart 200 may be configured to index shelves of the movable cart in the z-axis direction to perform the next required operation until the changeover sequence is completed. Once completed, the movable cart 200 is configured to move the shelf supporting the stencil and/or tooling tray in the y-axis direction to a home position. Next, the movable cart 200 is configured to move the shelves in the z-axis direction to a home position to enable the stencil printer 100 to resume production. At this point, the movable door 110 of the cover 102 of the stencil printer 100 is interlocked to protect the operator when closing the movable door.

The movable cart 200 can either remain docked to the stencil printer 100 or be removed once the loading or unloading is completed.

Figure 11:
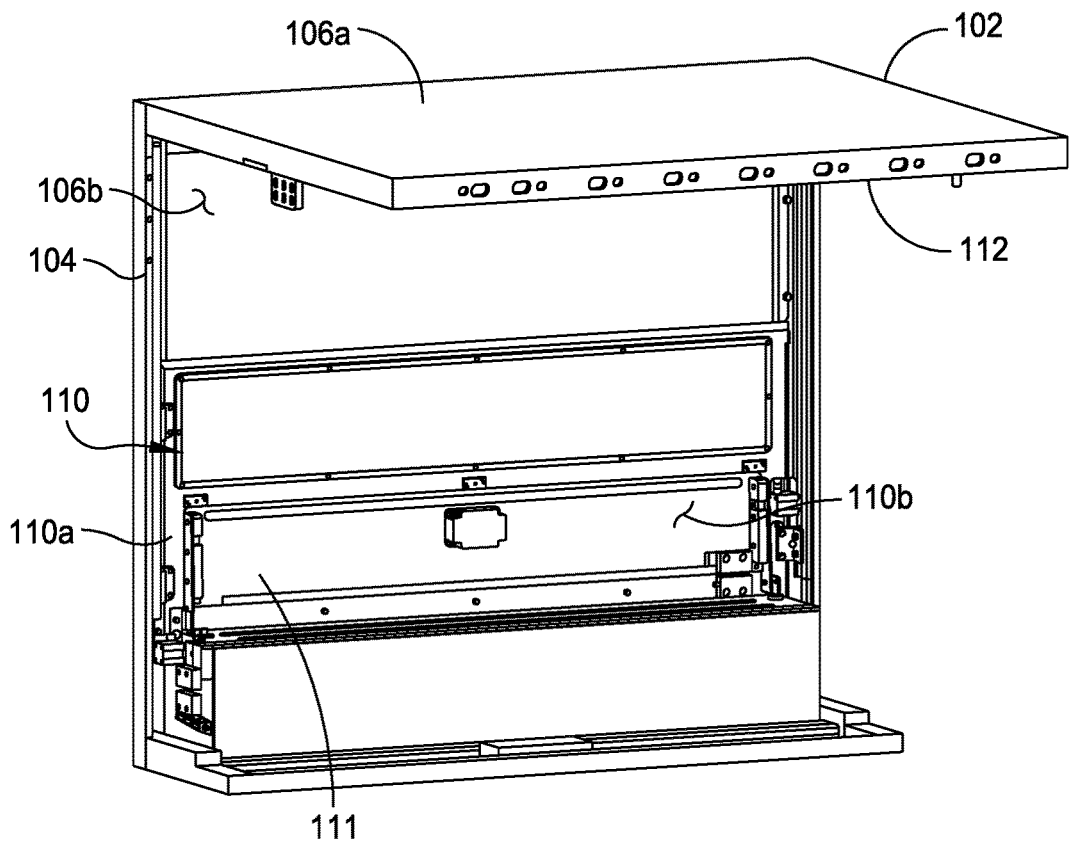
FIG. 11 is a perspective view of a cover of an embodiment of the present disclosure.
Figure 12:
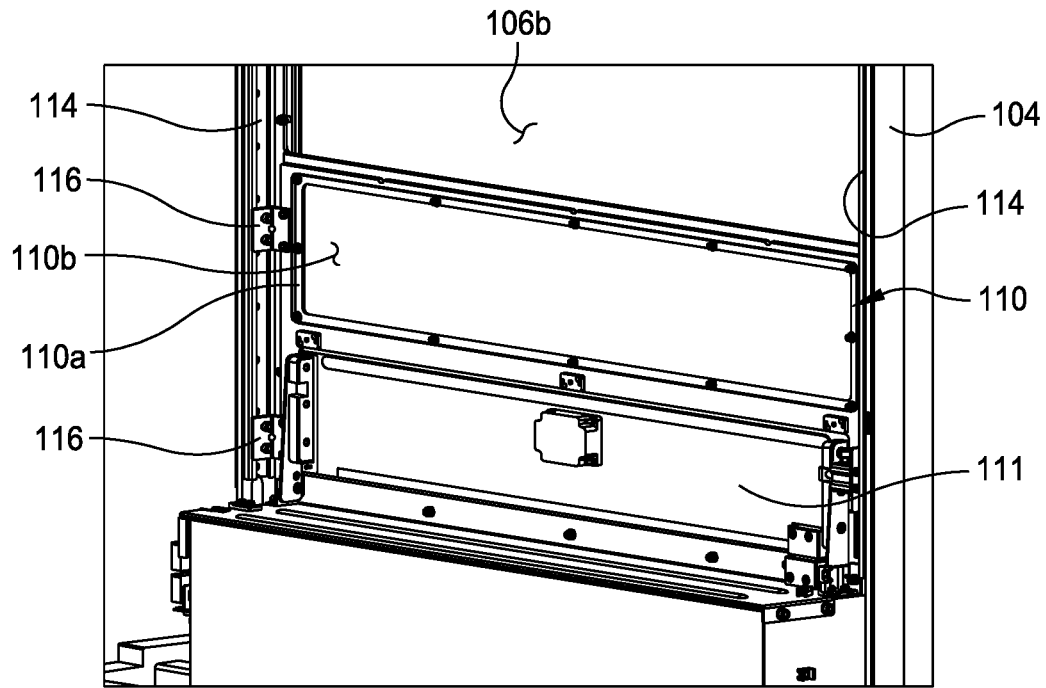
FIG. 12 is a perspective view of a movable door of the cover shown in FIG. 11.

Referring to FIGS. 11 and 12, the cover 102 of the stencil printer 100 is shown to be removed from the stencil printer 100. As mentioned above and shown, the cover 102 includes the L-shaped frame 104 having an edge that is hingedly attached to the frame of the stencil printer 100 by hinge 112. One portion of the L-shaped frame 104 has a first solid panel 106a and another portion of the L-shaped frame has a second clear panel 106b that extends vertically when the cover 102 is in a closed position. In one embodiment, the hinge 112 is mounted at the top rear of the frame of the stencil printer 100, which attaches to a cross member of the frame 104 of the cover 102.

With reference to FIG. 12, the movable door 110 is configured to move up and down inside of the cover 102. In one embodiment, the movable door 110 includes a rectangular frame 110a having a see-through panel 110b and the access panel 111. As described above, the access panel 111 is hingedly connected to the frame 110a along a bottom edge of the access panel. The cover 102 includes two linear slides, each indicated at 114, with one slide being attached to the frame 104 of the cover 102 on an inner left hand of the cover, and the other slide being attached to the frame of the cover on an inner right hand side of the cover. The linear slides 114 are attached to the movable door 110 using four mounting brackets, each indicated at 116, which allow the movable door to move vertically up and down inside the cover 102. Specifically, two mounting brackets 116 are secured to the frame 110b of the movable door on one side of the frame and two mounting brackets are secured to the frame of the movable door on the other side of the frame. The mounting brackets 116 are each configured to glide along the linear slide 114 to enable the up-and-down movement of the movable door 110 with respect to the frame 104 of the cover.

Figure 13:
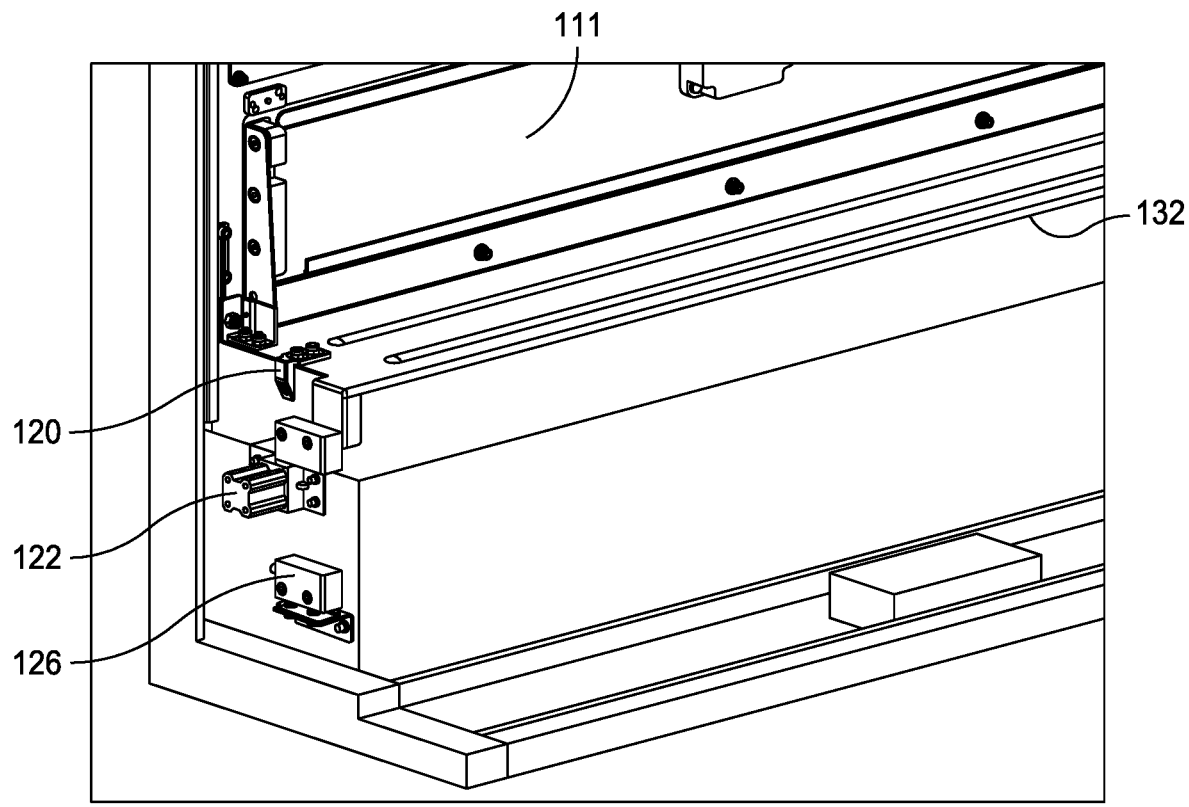
FIG. 13 is an enlarged perspective view of an interlock assembly of the movable door, with the movable door being shown in an open position.
Figure 14:
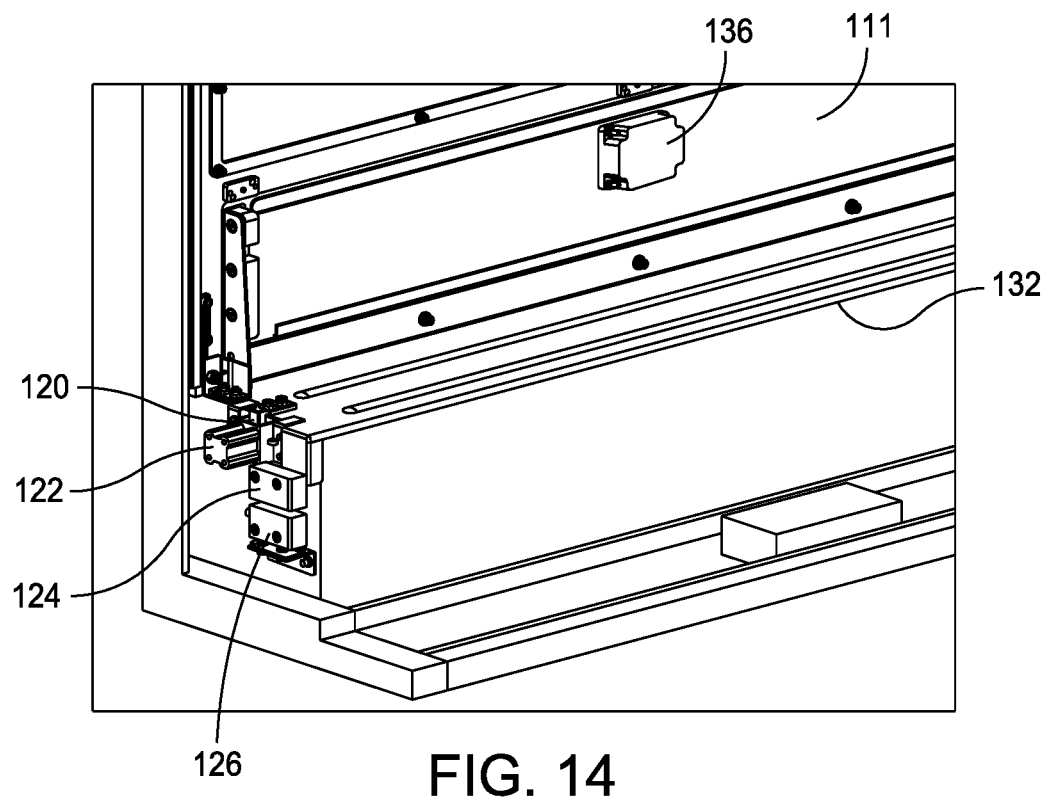
FIG. 14 is an enlarged perspective view of the interlock assembly of the movable door, with the movable door being shown in a closed position.

Referring to FIGS. 13 and 14, the cover 102 includes a pneumatic interlock assembly to secure the position of the movable door 110. As shown, the pneumatic interlock assembly includes an interlock latch 120 provided on the movable door 110 and an interlock cylinder 122 provided on the cover 102. The interlock cylinder 122 is configured to releasably secure the interlock latch 120 to secure the movable door 110 in the closed position. The pneumatic interlock assembly further includes a switch transmitter 124 provided on the movable door 110 and a switch receiver 126 provided on the cover 102. The switch transmitter and receiver 124, 126 are provided to ensure that the movable door 110 is in a closed position prior to operating the working components of the stencil printer 100. In another embodiment, the pneumatic interlock assembly includes a switch that is provided to detect that the door 110 is in a closed position. In one example, the switch can be a plunger-type switch.

Figure 15:
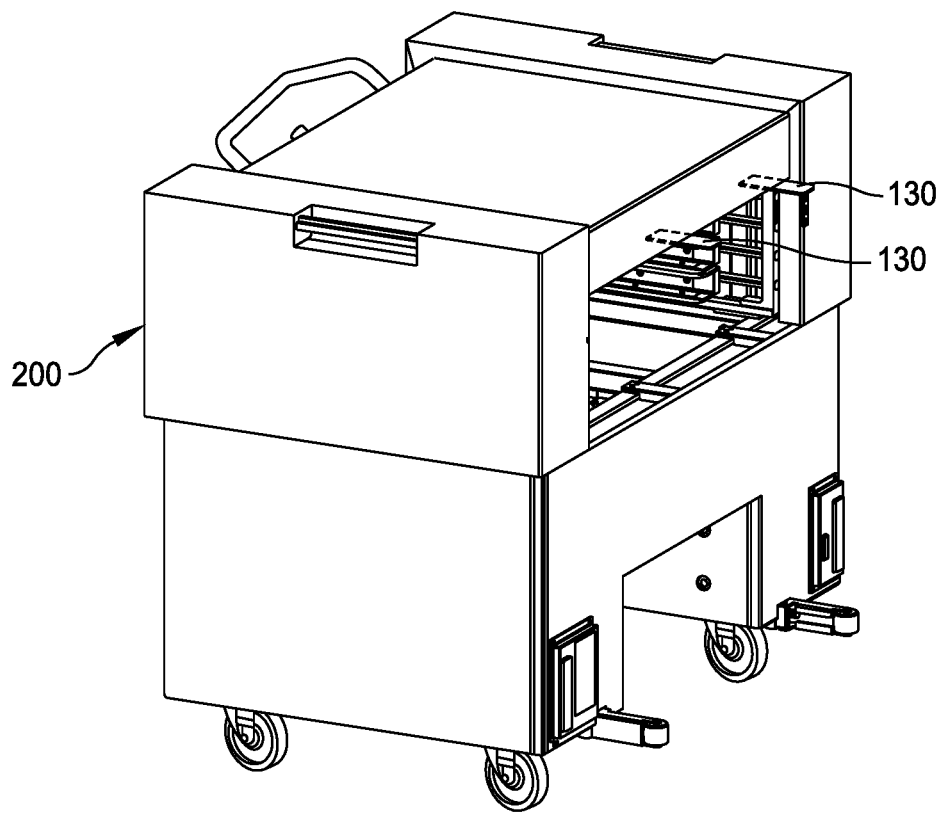
FIG. 15 is a perspective view of a movable cart of an embodiment of the present disclosure, the movable cart having brackets configured to interact with the movable door of the cover.
Figure 16:
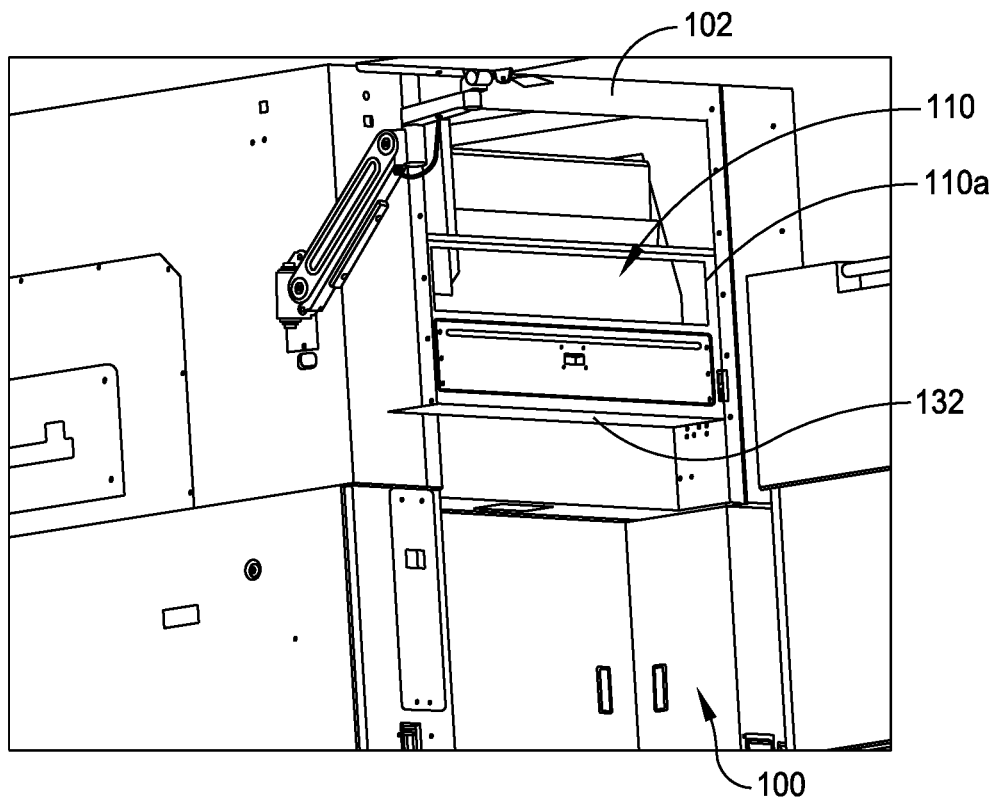
FIG. 16 is a perspective view of a portion of the movable door of the cover of the stencil printer.

Referring to FIGS. 15 and 16, as previously mentioned, the movable cart 200 includes two lift brackets, each indicated at 130, which are located on a front of the movable cart and are provided to engage an underside of the movable door 110 of the cover 102. Although provided at the front of the movable cart 200, the two lift brackets 130 can be positioned and/or arranged with respect to the movable cart in any desired manner convenient to lift the movable door 110. Once the movable cart 200 is docked with respect to the stencil printer 100, the two lift brackets 130 are positioned to slide under a bottom lip 132 of the frame 110a of the movable door 110, which is illustrated in FIG. 16. Once the movable cart 110 is initialized and begins to move the vertical shelves on the movable cart to align with a stencil shelf in the stencil printer 100, the two brackets 130 passively lift the movable door 110 so that the appropriate stencil and/or tooling tray can be loaded into the stencil printer or unloaded from the stencil printer to the movable cart as the case may be.

Figure 17:
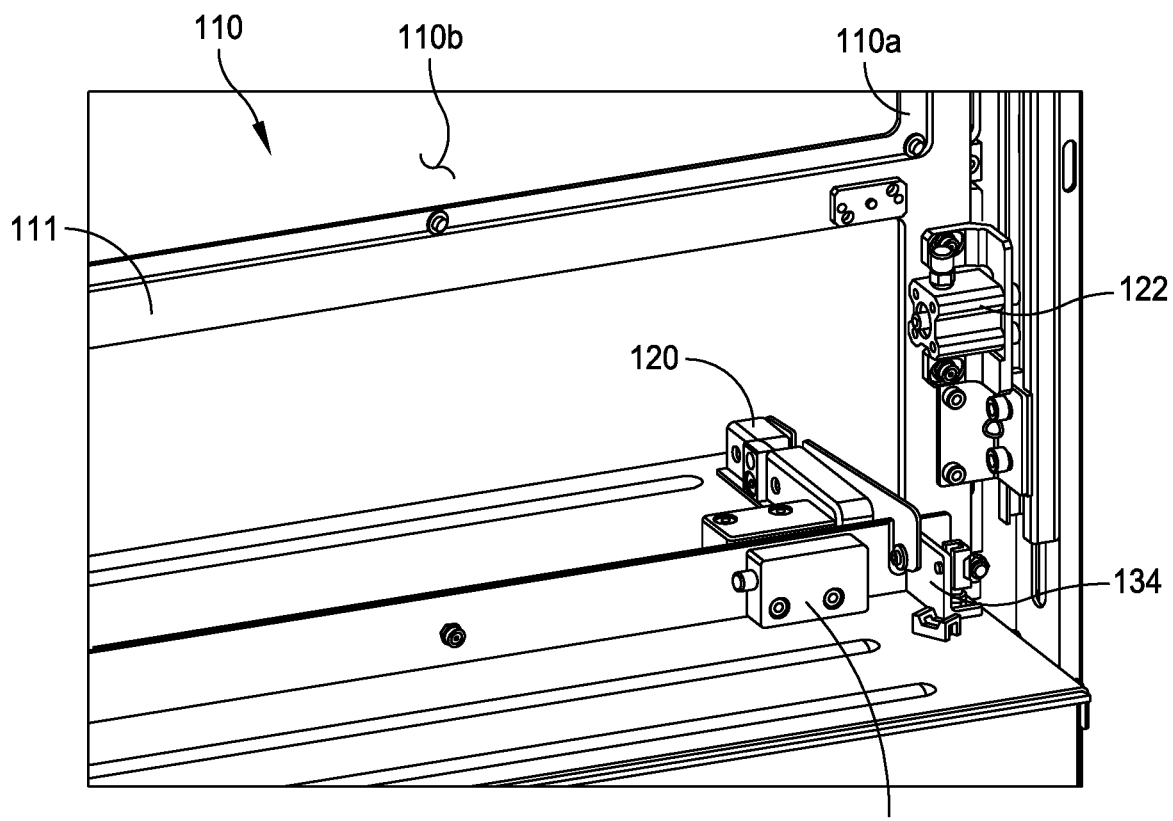
FIG. 17 is an enlarged perspective view of a portion of the movable door of the cover, with the movable door being shown in an open position.
Figure 18:
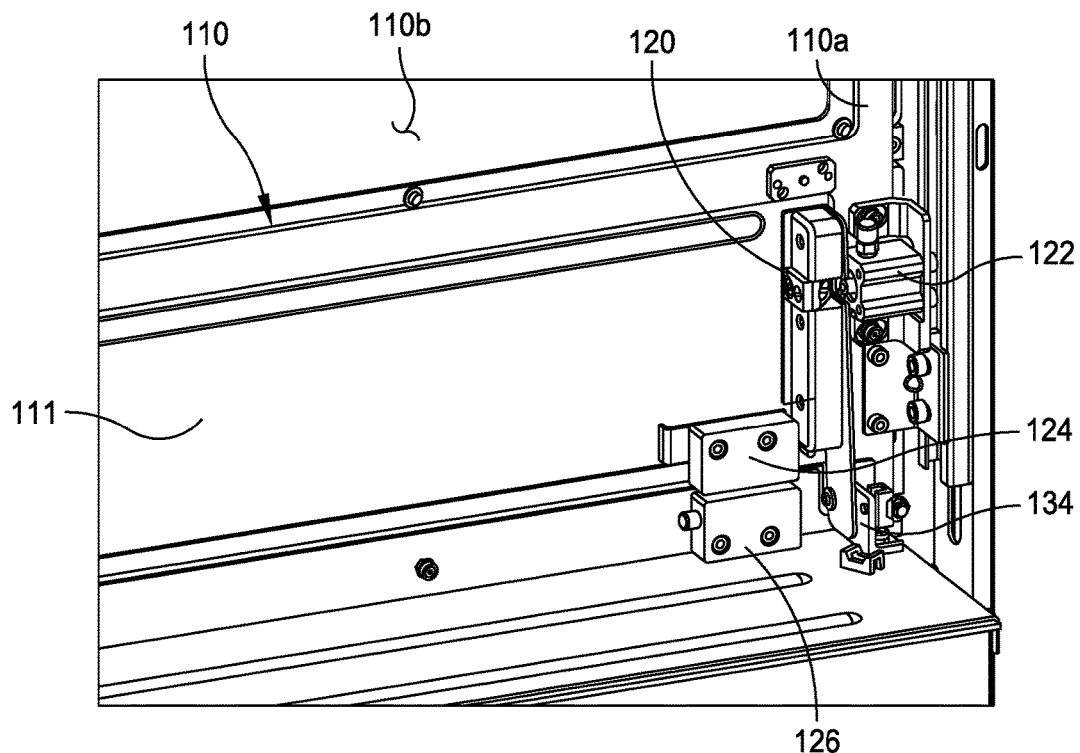
FIG. 18 is an enlarged perspective view of a portion of the movable door of the cover, with the movable door being shown in a closed position.

Referring to FIGS. 17 and 18, the access panel 111 of the movable door 110 is shown open in FIG. 17 and shown closed in FIG. 18. A hinge 134 is provided to allow the movement of the access panel 111 of the movable door between the open and close positions. The hinge 134 is secured to the frame 110a of the movable door 110 and the access panel 111. A similar hinge is provided on the opposite side of the access panel. The operating components of the movable door 110, including the interlock latch 120 and the interlock cylinder 122 as well as the switch transmitter 124 and the switch receiver 126 are further illustrated.

Figure 19:
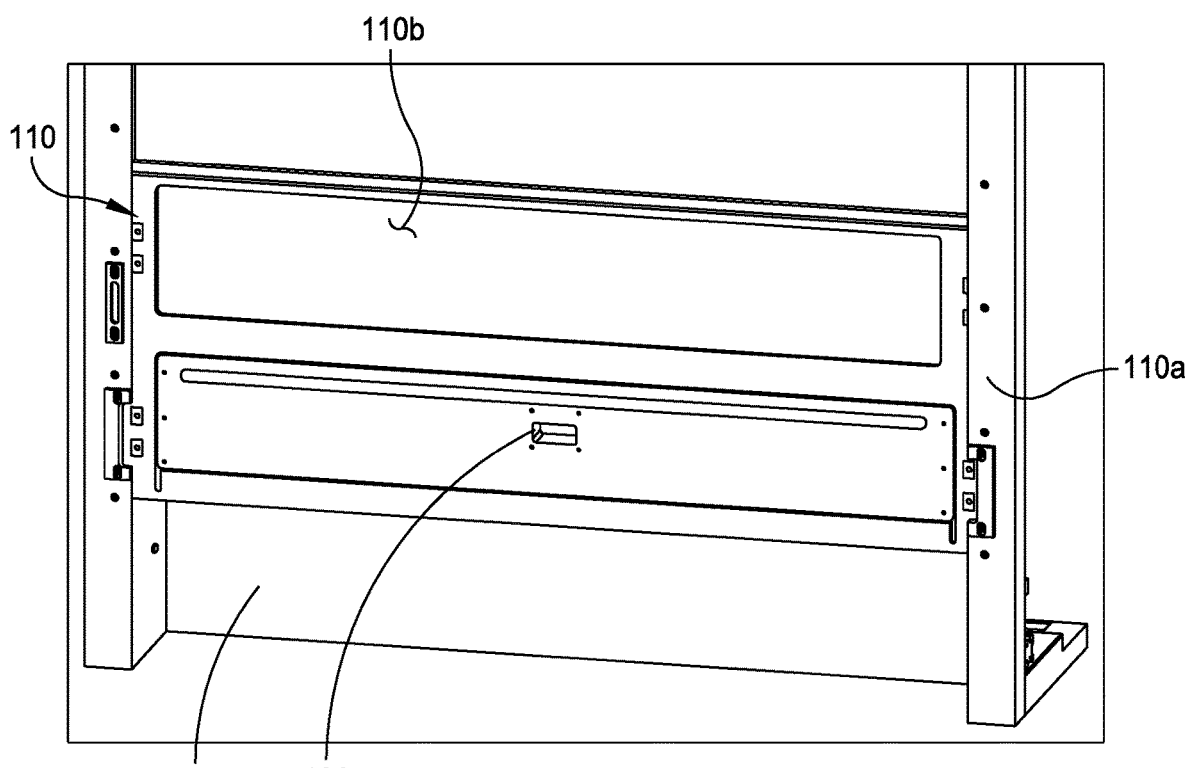
FIG. 19 is a perspective view of the movable door showing a handle provided on the movable door.

Referring to FIG. 19, an operator can open and close the access panel 111 of the movable door 110 by using a handle 136 provided on an outer surface of the access panel. The manual operation of the access panel 111 of the movable door 110 can only occur once a changeover has been initiated and the pneumatic interlock assembly is disengaged. Once this task is performed, the access panel 111 of the movable door 110 can be opened, which breaks a connection with the switch. When the access panel 111 of the movable door 110 is opened, the stencil printer 100 is essentially inoperable until the switch is closed.

Figure 20:
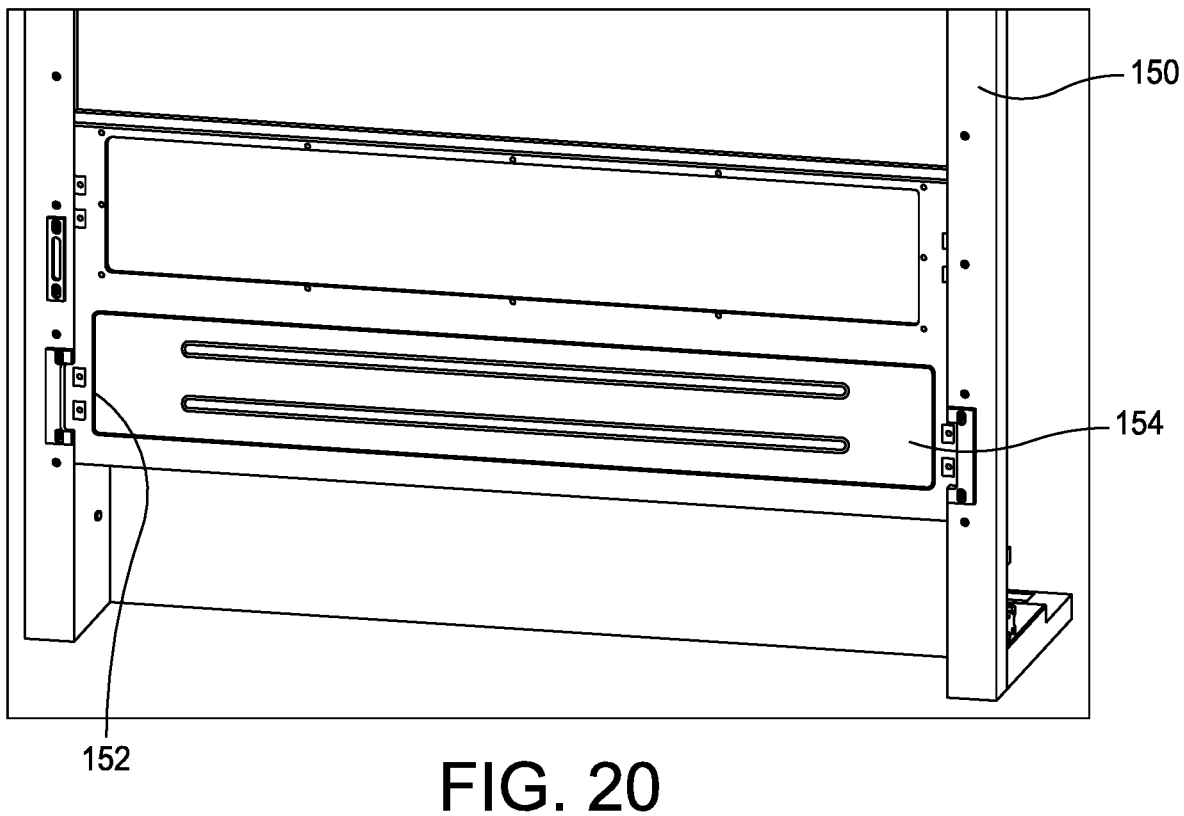
FIG. 20 is a perspective view of a movable door of another embodiment of the present disclosure, with the movable door being shown in a closed position.
Figure 21:
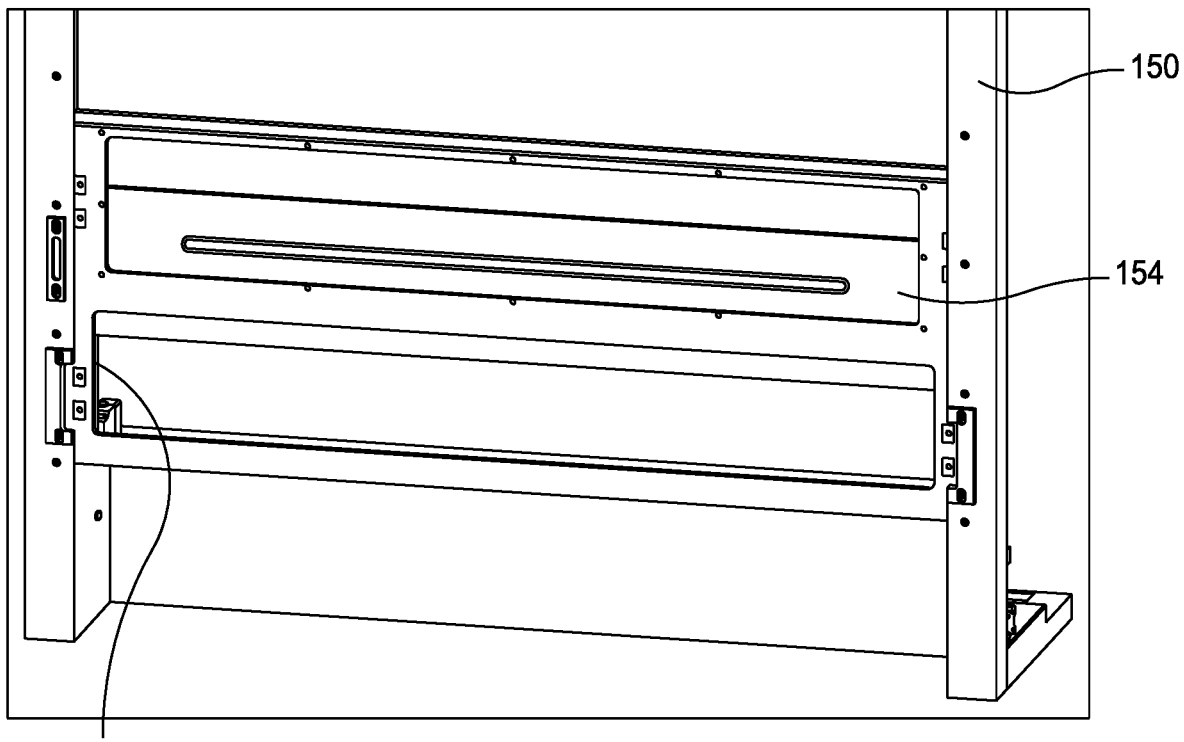
FIG. 21 is a perspective view of the movable door of FIG. 20, with the movable door being shown in an open position.
Figure 22:
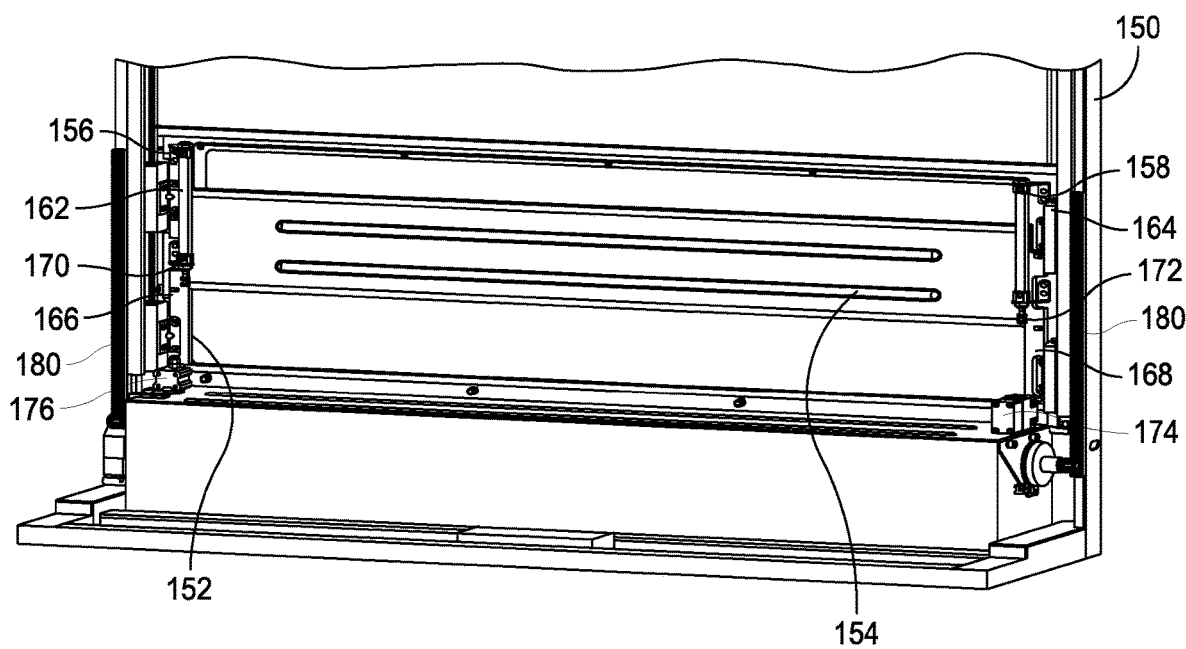
FIG. 22 is another perspective view of the movable door of FIGS. 20 and 22 taken from an opposite side of the movable door, with the movable door being shown in the open position.

Referring to FIGS. 20-22, in another embodiment, a stencil printer cover 150 includes an elongate slot 152 and a movable door 154, which is slidably attached to the cover and movable between a closed position (FIG. 20) and an open position (FIG. 21). FIG. 22 illustrates the other side of the movable door 154, with the movable door being shown in the open position. The construction of the stencil printer cover 150 and the movable door 154 is similar to the cover 102 and movable door 110 assembly shown and described above. The movable door 154 is configured to move up and down by automatically, either by an operator or the controller of the stencil printer.

As shown in FIG. 22, the movable door 154 is secured to the stencil printer cover 150 by a first set of fixed brackets secured to the cover, with one fixed bracket 156 being secured to the cover on one side of the elongate slot 152 and the other fixed bracket 158 being secured to the cover on an opposite side of the elongate slot. Each bracket 156, 158 of the first set of fixed brackets includes a vertically mounted cylinder 162, 164, respectively. Each cylinder 162, 164 is guided by a vertically mounted door guides or retainers 166, 168, respectively. There is a second set of brackets attached to the movable door 154 and attached to respective cylinder shafts of the cylinders 162, 164 to drive the up-and-down movement of the movable door, with one bracket 170 being secured to the movable door on one side of the movable door and the other bracket 172 being secured to the movable door on an opposite side of the movable door.

The movable door 154 further includes a rack and pinion and damped rotational assembly 180 so that when the door is lifted, the door returns to the home (closed) position. Stated another way, the movable door is free to move in the up or open direction and when moved to the down or closed direct, the rack and pinion and damped rotational assembly 180 provides a resistance to the downward movement of the movable door to prevent the movable door from slamming shut.

To open the movable door 154, the operator (or software associated with the controller of the stencil printer) issues a command to open the movable door. In one embodiment, the operator can enter the command on a graphic user interface (GUI) associated with the display of the stencil printer. Once this is done, the stencil printer will be inhibited when a sensor/switch 174 is decoupled from the movable door 154. This movable door 154 is secured in a closed position to close access to the elongate slot 152 by an interlock assembly 176 and the sensor/switch 174.

Although systems such as light curtain or camera monitoring have been used to protect operators from engaging pinch points associated with the movable parts of the stencil printer, including the movable door, such systems have shortcomings related to cost and proximity to the pinch points that may interfere with the normal operation of the automated machine by accidental false triggers. Embodiments of the present disclosure are directed to a system used to protect operators.

Figure 23:
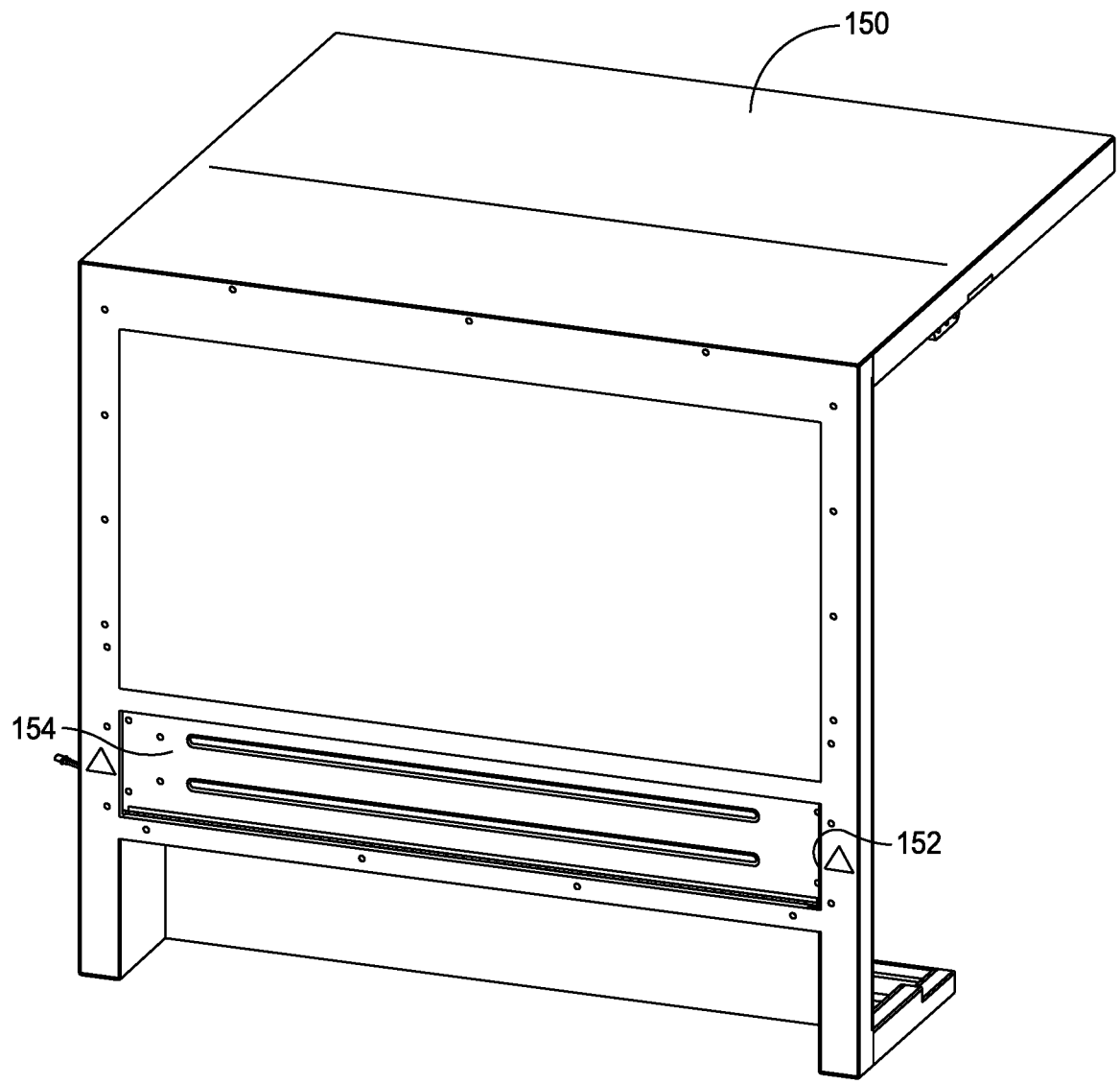
FIG. 23 is a front perspective view of the stencil printer cover showing the movable door in the closed position.
Figure 24:
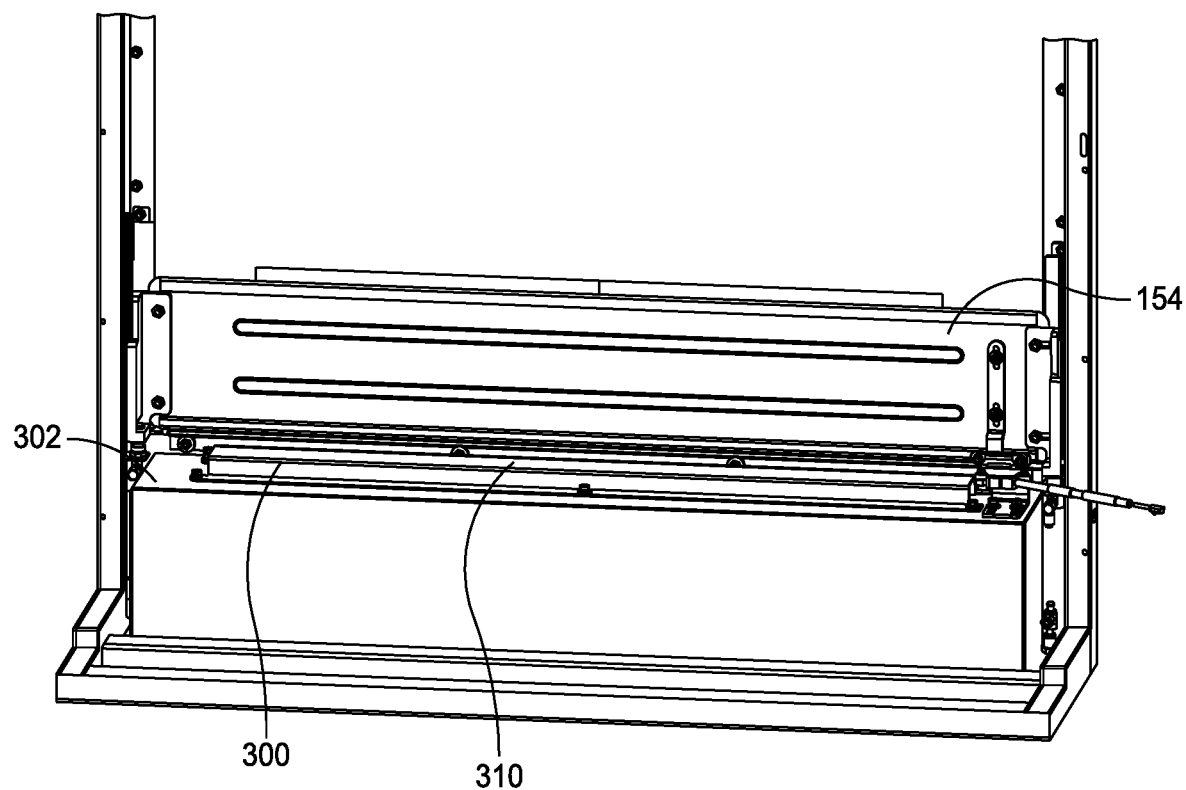
FIG. 24 is an enlarged back perspective view of the stencil printer cover and the movable door shown in FIG. 24.

Referring to FIGS. 23 and 24, the stencil printer cover 150 shows the movable door 154 is in the closed position. Embodiments of the present disclosure are directed to a sensor assembly that is configured to detect the presence of an object within the elongate slot 152 when closing the movable door 154. As best shown in FIG. 24, the elongate slot 152 has a linear resistive pressure sensor 300 mounted on a bottom edge 302 of the elongate slot. In one embodiment, the linear resistive pressure sensor 300 is manufactured by Spectra Symbol and sold under model name ThinPot™. In some embodiments, the linear resistive pressure sensor 300 can be disposed around the entire edge of the elongate slot 152, not just the bottom edge 302 of the elongate slot. The linear resistive pressure sensor 300 is provided to detect the presence of an object, such as a person's finger or hand, when closing the movable door 154. As will be described in greater detail below, the linear resistive pressure sensor 300 is coupled to a controller, such as controller 14, and configured to generate a signal to the controller that an object is impeding the closing of the movable door 154.

The sensor assembly further includes a foam laminate strip of material 310 secured as by an adhesive strip to the linear resistive pressure sensor 300 on the bottom edge 302 of the elongate slot 152. In one embodiment, the foam laminate 310 is manufactured by McMaster Carr and sold under model number 93275k121. Although a foam material is described, the laminate can be fabricated from a suitable soft durometer material, such as a soft gel or rubber material. In some embodiments, the foam laminate 310 can be secured around the entire edge of the elongate slot 152, not just the bottom edge 302 of the elongate slot. The foam laminate 310 provides an added layer of protection, with the foam laminate being provided to protect a bodily part, such as a person's finger or hand, from being crushed or otherwise harmed between the engagement of the movable door 154 and the bottom edge 302 of the elongate slot 152 when closing the movable door. In some embodiments, the movable door 154 is a solid structure or includes a solid frame that is sized and configured to engage the solid frame that defines the elongate slot 152. Thus, the provision of the foam laminate 310 provides a cushion or space to protect the person if the person's hand or finger is caught during movement of the movable door 154 to the closed position.

Figure 25:
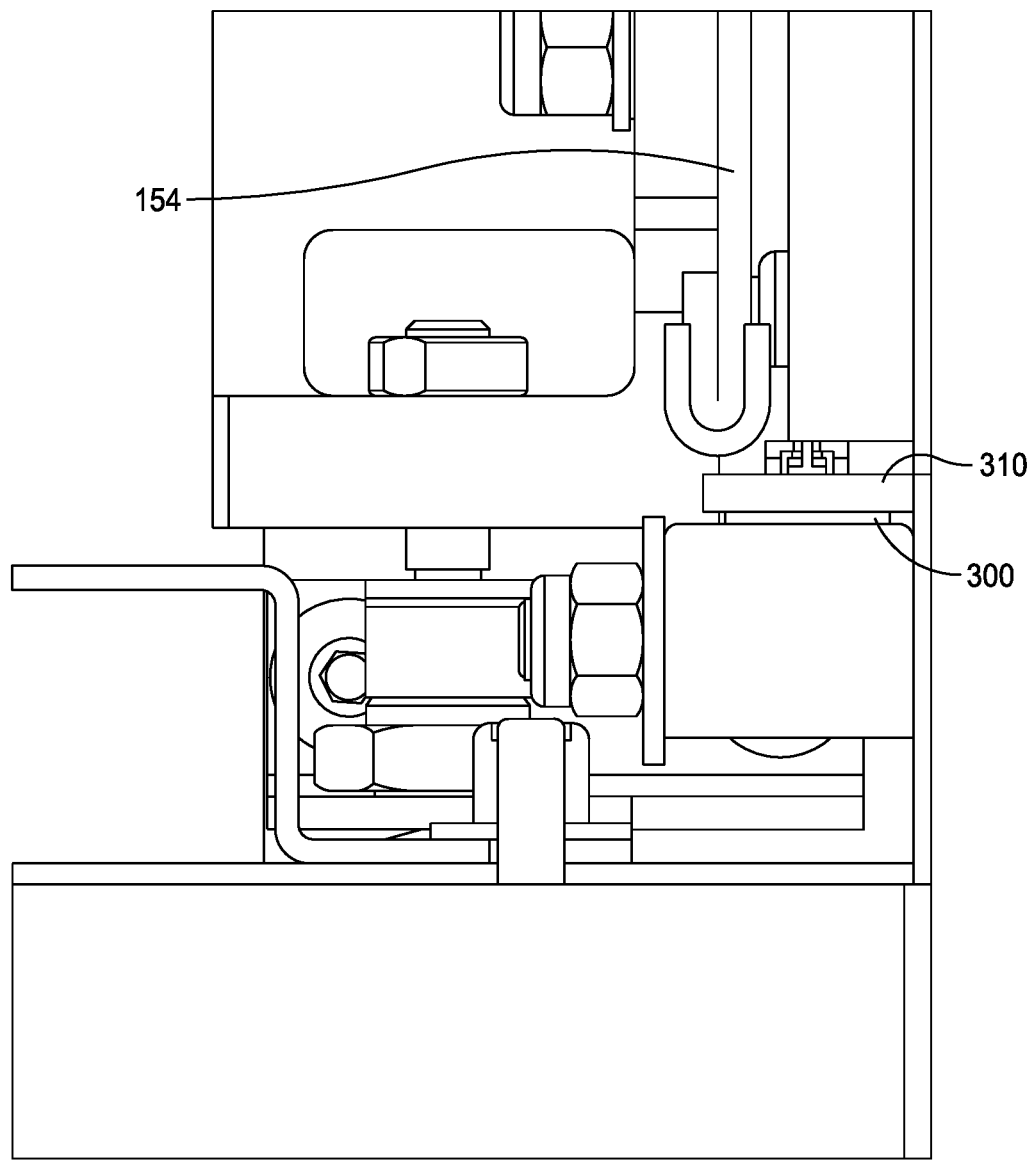
FIG. 25 is an enlarged cross-sectional view of a portion of the movable door and an elongate opening having a linear resistive pressure sensor and a foam laminate positioned on a bottom edge of the elongate opening.

Referring additionally to FIG. 25, the movable door 154 is in the closed position and the foam laminate 310 is clearly shown extending along the bottom edge 302 of the elongate slot 152. The bottom edge 302 of the movable door 154 is shown spaced from the foam laminate 310, with the linear resistive pressure sensor 300 positioned under the foam laminate. The thickness of the foam laminate 310 can be increased or decreased depending on the amount of force being used to close the movable door 154.

Figure 26:
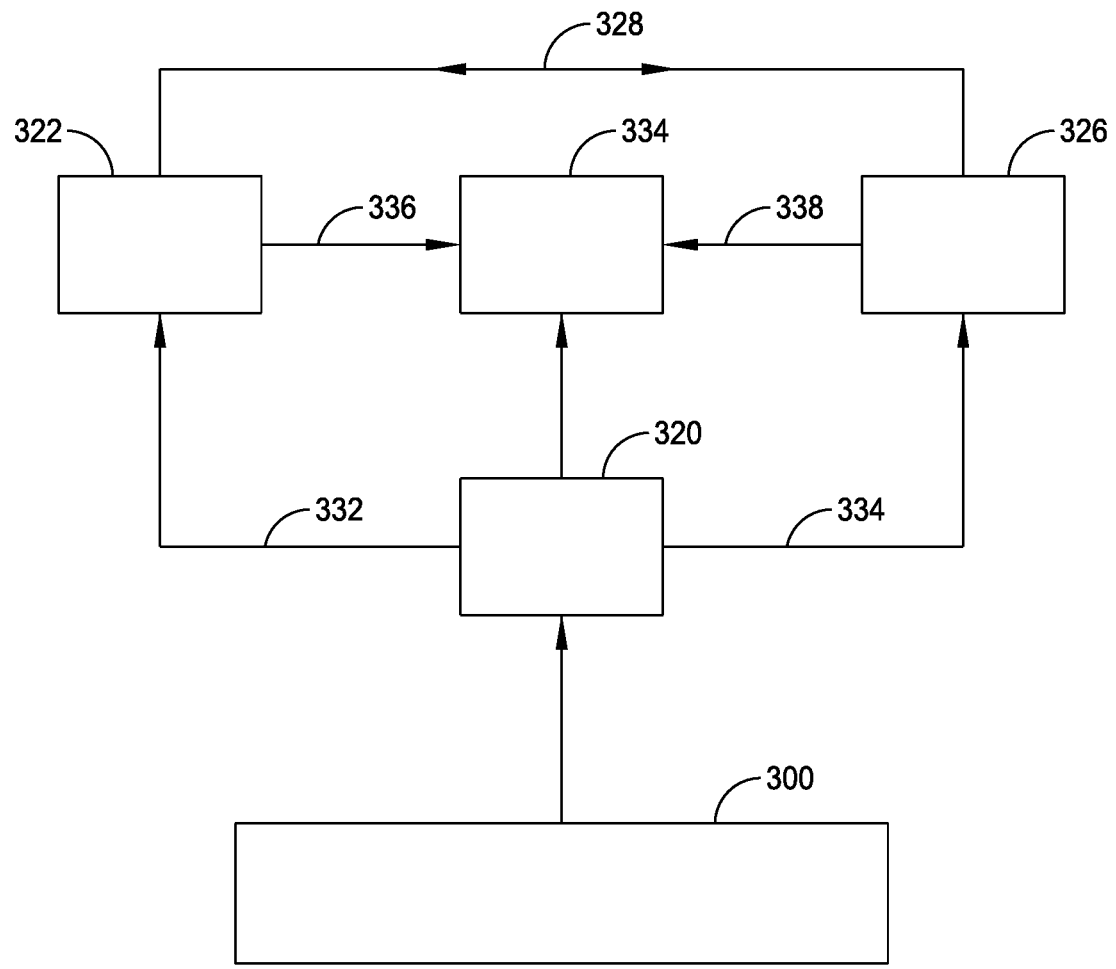
FIG. 26 is a diagram showing a control scheme of the movable door.

Referring to FIG. 26, a simplified control scheme of the operation of the linear resistive pressure sensor 300 is shown. The linear resistive pressure sensor 300 is coupled to a conversion printed circuit board or PCB 320, which is coupled to an automated machine personal computer PC 322 (same as controller 14), pneumatic controls 324 associated with the movable door 154, and a servo/stepper motor controller 326 associated with the movable door. As shown, the linear resistive pressure sensor 300, when depressed by an object, such as a person's hand or finger, is configured to generate a pressure sensor feedback interrupt signal 330 to the conversion PCB 320, which in turn is configured to generate a signal 332 to the automated machine PC 322 and a signal 334 to the servo/stepper motor controller 326, respectively. The automated machine PC 322 is configured to generate a signal 336 to the pneumatic controls 324 and the servo/stepper motor controller 326 is configured to generate another redundant signal 338 to the pneumatic controls 324. A CAN BUS 328 is provided to enable bi-directional communication between the automated machine PC 322 and the servo/stepper motor controller 326.

A method of controlling the movement of the movable door 154 is provided to ensure operation of loading tooling in and out of the stencil printer. The elongate opening 152 provided in the stencil cover of the stencil printer is used for loading stencils and tooling on a tooling tray in and out of the stencil printer. The movement of these items can create hazards, such as crush or pinch points for body extremities, if there was an unexpected or accidental command to close the movable door 154 with a body extremity (e.g., a person's fingers, hands or wrists) in the path of the movable door.

The sensor assembly described herein can be utilized to monitor in real-time the pinch or crushing hazards associated with the movable door 154 that closes to remove access to the moving parts within the stencil printer. The sensor assembly utilizes a pressure sensitive resistive element laminated with a soft foam coating embodying the foam laminate 310 that is configured to conform to the shape of the extremity. This conformity aids in eliminating injury, while in parallel the linear resistive pressure sensor 300 is connected to the primary circuit that converts the resistive signal to logic level signals that have redundant monitoring by the controller of the stencil printer and motion control system via CAN BUS 328, that will inhibit any motion from occurring within the stencil printer. Additionally, the sensor assembly prevents any further commands issued by the controller of the stencil printer until the hazard is removed. In one embodiment, the primary circuit also has an interrupt that is directly tied to the pneumatic controller 324 that opens the door upon detection of any object less than one half millimeter thickness with less than 3.5 oz-force to remove any propagation delay in the main communication circuit. This redundant system works in parallel with the standard interlock that monitors any unsolicited entry to the stencil printer.

Various controllers, such as the controller 14 and/or conversion PCB 320, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing an assembly material on an electronic substrate, the stencil printer comprising:
   a frame;
   a stencil coupled to the frame, the stencil having apertures formed therein;
   a support assembly coupled to the frame, the support assembly being configured to support the electronic substrate in a print position beneath the stencil;
   a print head gantry coupled to the frame;
   a print head assembly supported by the print head gantry in such a manner that the print head assembly is configured to traverse the stencil during print strokes, the print head assembly including a print head having a squeegee blade assembly configured to roll solder paste along the stencil;
   a cover coupled to the frame to enclose operating components of the stencil printer, including the stencil, the support assembly, the print head gantry and the print head assembly, the cover being hingedly mounted to the frame of the stencil printer and movable between a closed position and an open position, the cover including an elongate opening formed therein and a movable door configured to selectively close the elongate opening, the elongate opening being sized to enable the stencil and/or a tooling tray to pass through, the movable door being slidably coupled to the cover to enable movement of the movable door with respect to the cover between the closed position and the open position;

a controller coupled to the movable door, the controller being configured to control movement of the movable door between a closed position and an open position; and a sensor assembly proximate the elongate opening, the sensor assembly being coupled to the controller and configured to detect an object within the elongate opening when moving the movable door to the closed position, wherein the sensor is configured to generate a signal to the controller when detecting an object within the elongate opening, wherein the controller, upon receiving the signal from the sensor, is configured to move the movable door to the open position, and wherein the sensor assembly includes a linear resistive pressure sensor configured to detect a force created by the object when engaging the linear resistive pressure sensor.

2. The stencil printer of claim 1, wherein the sensor assembly further includes a foam or soft laminate disposed on the linear resistive pressure sensor.

3. The stencil printer of claim 1, wherein the linear resistive pressure sensor is coupled to a conversion PCB and configured to generate a pressure sensor feedback interrupt signal when detecting the force created by the object.

4. The stencil printer of claim 3, wherein the conversion PCB is coupled to an automated machine personal computer PC, pneumatic controls, and a servo/stepper motor controller associated with the movable door.

5. The stencil printer of claim 4, wherein the conversion PCB is configured to generate a signal to the automated machine PC and a signal to the servo/stepper motor controller.

6. The stencil printer of claim 5, wherein a CAN BUS is provided to enable bi-directional communication between the automated machine PC and the servo/stepper motor controller.

7. The stencil printer of claim 1, wherein the movable door includes a movable door frame and at least one panel secured to the movable door frame.

8. The stencil printer of claim 7, wherein the cover further includes two linear slides mounted on the cover frame of the cover, and wherein the movable door further includes a mounting bracket secured to the movable door frame of the movable door.

9. The stencil printer of claim 8, wherein the cover further includes a first linear slide secured to the cover frame of the cover on one side of the movable door and a second linear slide secured to the cover frame of the cover on the other side of the movable door.

10. The stencil printer of claim 9, wherein the movable door further includes at least one first mounting bracket secured to the movable door frame of the movable door on one side of the movable door and at least one second mounting bracket secured to the movable door frame of the movable door on the other side of the movable door.

11. The stencil printer of claim 1, wherein the cover further includes a pneumatic interlock assembly to secure the position of the movable door in the closed position.

12. The stencil printer of claim 11, wherein the pneumatic interlock assembly includes a switch to ensure that the movable door is in a closed position prior to operating the stencil printer.

13. The stencil printer of claim 1, wherein the movable door is configured to be moved by at least one lift bracket associated with a movable cart.

14. The stencil printer of claim 1, wherein the movable door includes an access panel hingedly mounted to a frame of the movable door, the access panel being configured to be manipulated manually between open and closed positions.

15. The stencil printer of claim 1, wherein the movable door includes an assembly configured to provide a resistance to a downward movement of the movable door.

16. A method of presenting a stencil or items within a stencil printer, the method comprising:
    inserting the stencil into and/or removing a tooling tray from an elongate opening provided in a cover of the stencil printer;
    closing a movable door configured to close the elongate opening;
    detecting an object within the elongate opening when moving the movable door to the closed position; and
    opening the movable door upon detecting the object,
    wherein detecting the object within the elongate opening includes generating a signal to a controller of the stencil printer, the controller being configured to move the movable door to the open position,
    wherein detecting the object within the elongate opening is performed by a sensor assembly coupled to the controller, and
    wherein the sensor assembly includes a linear resistive pressure sensor configured to detect a force created by the object when engaging the linear resistive pressure sensor.

17. The method of claim 16, further comprising cushioning the object.

18. The method of claim 17, wherein the object is cushioned by a foam laminate disposed on the linear resistive pressure sensor.

19. The method of claim 16, wherein the linear resistive pressure sensor is coupled to a conversion PCB and configured to generate a pressure sensor feedback interrupt signal when detecting the force created by the object.

20. The method of claim 19, wherein the conversion PCB is coupled to an automated machine personal computer PC pneumatic controls associated with the movable door, and a servo/stepper motor controller associated with the movable door.

21. The method of claim 20, wherein the conversion PCB is configured to generate a signal to the automated machine PC and a signal to the servo/stepper motor controller.

22. The method of claim 21, wherein a CAN BUS is provided to enable bi-directional communication between the automated machine PC and the servo/stepper motor controller.

* * * * *